US009773847B2

(12) United States Patent
Epstein et al.

(10) Patent No.: US 9,773,847 B2
(45) Date of Patent: Sep. 26, 2017

(54) ANTIREFLECTIVE OLED CONSTRUCTION

(71) Applicant: 3M INNOVATIVE PROPERTIES COMPANY, St. Paul, MN (US)

(72) Inventors: Kenneth A. Epstein, St. Paul, MN (US); Adam D. Haag, Woodbury, MN (US); Seong Taek Lee, Woodbury, MN (US); Sergey Lamansky, Redmond, WA (US)

(73) Assignee: 3M Innovative Properties Company, St. Paul, MN (US)

( * ) Notice: Subject to any disclaimer, the term of this patent is extended or adjusted under 35 U.S.C. 154(b) by 6 days.

(21) Appl. No.: 14/895,046

(22) PCT Filed: Jun. 4, 2014

(86) PCT No.: PCT/US2014/040801
§ 371 (c)(1),
(2) Date: Dec. 1, 2015

(87) PCT Pub. No.: WO2014/197539
PCT Pub. Date: Dec. 11, 2014

(65) Prior Publication Data
US 2016/0118448 A1    Apr. 28, 2016

Related U.S. Application Data

(60) Provisional application No. 61/831,819, filed on Jun. 6, 2013, provisional application No. 62/003,762, filed on May 28, 2014.

(51) Int. Cl.
*H01L 51/52* (2006.01)
*H01L 27/32* (2006.01)

(52) U.S. Cl.
CPC ...... *H01L 27/3244* (2013.01); *H01L 51/5268* (2013.01); *H01L 51/5271* (2013.01); *H01L 51/5281* (2013.01); *H01L 51/5284* (2013.01)

(58) Field of Classification Search
CPC ............ H01L 27/3244; H01L 51/5268; H01L 51/5281; H01L 51/5271; H01L 51/5284
See application file for complete search history.

(56) References Cited

U.S. PATENT DOCUMENTS 5,751,388 A    5/1998    Larson
5,793,456 A    8/1998    Broer
(Continued)

FOREIGN PATENT DOCUMENTS

EP    2211397    7/2010
EP    2216840    8/2010
(Continued)

OTHER PUBLICATIONS

International Search report for PCT International Application No. PCT/US2014/040801 mailed on Sep. 4, 2014, 5 pages.

*Primary Examiner* — Douglas Menz
(74) *Attorney, Agent, or Firm* — Gregg H. Rosenblatt

(57) ABSTRACT

The disclosure relates to emissive displays and, in particular, to emissive displays that include a top surface (111) that has a diffusely reflective inactive surface (116) adjacent a diffusely reflective emissive surface (114). The emissive display further includes a polarization selective antireflection film component (120) that includes a linear absorbing polarizer (126), a reflective polarizer (124), and a quarter-wave retarder (122), and is positioned separated from the top surface. The disclosure also relates to issues arising from these antireflection film components, such as brightness efficiency loss and image degradation such as pixel blur. The enhanced antireflection stack performs well in commercial OLED displays, with a 20% or greater brightness gain, a 30% or greater ambient light reflectance gain and no visually apparent image degradation.

36 Claims, 18 Drawing Sheets

(56) References Cited

U.S. PATENT DOCUMENTS

| | | |
|---|---|---|
| 5,808,794 A | 9/1998 | Weber |
| 5,825,543 A | 10/1998 | Ouderkirk |
| 5,867,316 A | 2/1999 | Carlson |
| 5,882,774 A | 3/1999 | Jonza |
| 6,122,103 A | 9/2000 | Perkins |
| 6,486,997 B1 | 11/2002 | Bruzzone |
| 6,498,683 B2 | 12/2002 | Condo |
| 6,841,803 B2 | 1/2005 | Aizawa |
| 7,638,796 B2 | 12/2009 | Kwak |
| 8,058,783 B2 | 11/2011 | Park |
| 2002/0159019 A1 | 10/2002 | Pokorny |
| 2007/0085476 A1 | 4/2007 | Hirakata |
| 2009/0103165 A1* | 4/2009 | Kothari ............... G02F 1/13306 359/290 |
| 2010/0165660 A1 | 7/2010 | Weber |
| 2010/0320494 A1 | 12/2010 | Kim |
| 2013/0038201 A1 | 2/2013 | Fukuda |

FOREIGN PATENT DOCUMENTS

| | | |
|---|---|---|
| JP | 2005-317254 | 11/2005 |
| KR | 2008-0076384 | 8/2008 |
| WO | WO 2014-085197 | 6/2014 |
| WO | WO 2014-085199 | 6/2014 |

* cited by examiner

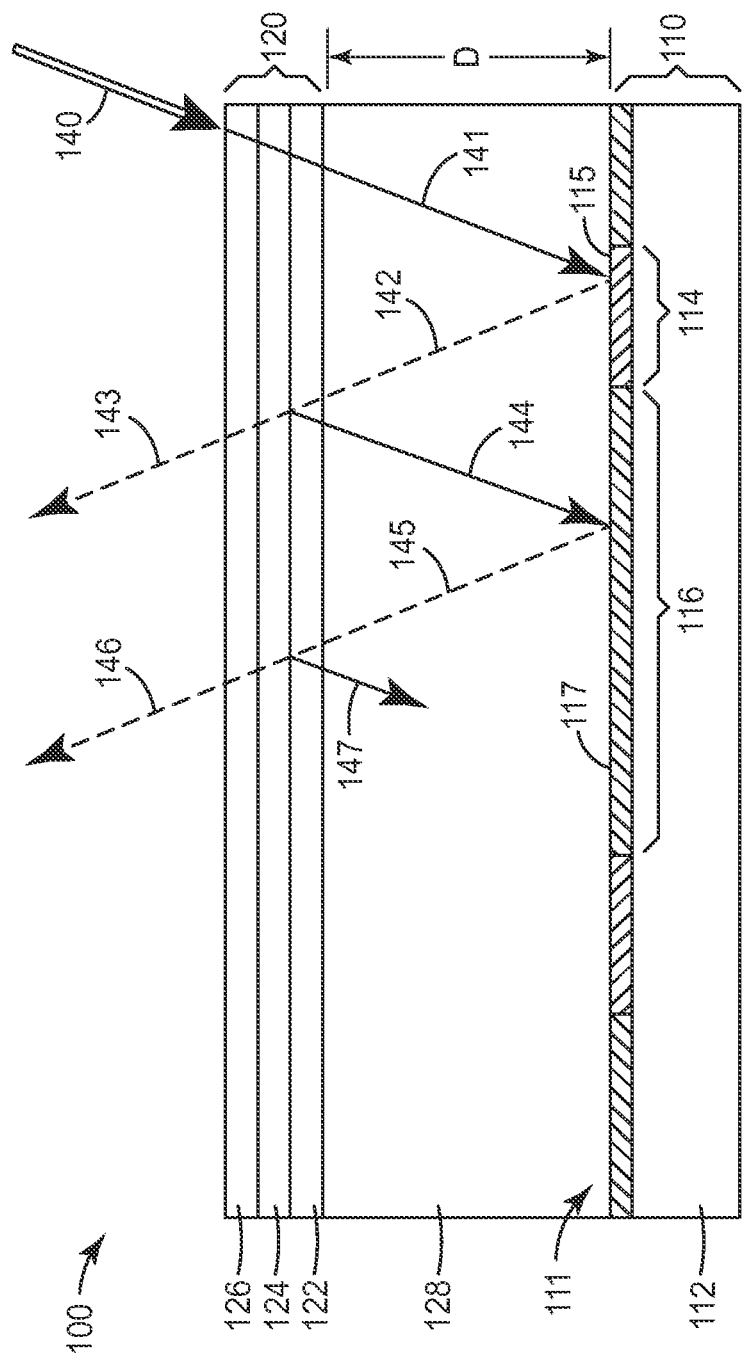

ANTIREFLECTIVE OLED CONSTRUCTION

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

Emissive displays such as OLEDs commonly use antireflection films such as circular polarizers to reduce reflection from ambient light caused by the metallic layers of the OLED. A circular polarizer comprised of a linear absorbing polarizer and a quarter-wave film extinguishes a large amount of ambient light incident on the display. This circular polarizer has the disadvantages of absorbing 50% or more of the emitted light from the OLED.

The display contrast is defined as the ratio (White-Black)/Black, where White is the brightest on-state and Black is the darkest off-state. In a darkened room, the contrast is limited by the intrinsic Black and White luminance values of the display device. In normal use the ambient light level and the display reflectance add to the intrinsic luminance levels. An ideal circular polarizer (CP) cuts the White state luminance by 50% and it reduces the ambient reflectance to that of the first surface of the polarizer. Because a practical QW element is exact at only one wavelength and only one view angle, hence there is a baseline reflectance.

In a bright ambient environment, such as daylight, the best commercial CP may be insufficient to maintain the required contrast, whereas, in a typical home or office environment the required contrast may be achieved without a high performance CP. The cost of the CP film stack must adjust with the performance value demanded in the intended use.

The display brightness is a key attribute that bears a cost in the expense of electronic drive capacity and its associated bulk as well as the emitter lifetime. In addition, the display power efficiency is an important consumer regulatory counterbalance to display brightness. The CP antireflection stack cuts the brightness and power efficiency by more than half. An anti-reflection component that also enhances brightness adds value.

SUMMARY

The disclosure relates to emissive displays and, in particular, to emissive displays that include a top surface that has a diffusely reflective inactive surface adjacent a diffusely reflective emissive surface. The emissive display further includes a polarization selective antireflection film component that includes a linear absorbing polarizer, a reflective polarizer, and a quarter-wave retarder, and is positioned separated from the top surface.

The present disclosure provides a novel construction for emissive displays and, in particular, to emissive displays that include polarization selective antireflection film components. The disclosure also relates to issues arising from these antireflection film components, such as brightness efficiency loss and image degradation such as pixel blur. In one aspect, the present disclosure provides a display element that includes an organic light emitting diode (OLED) having a top surface having a diffusely reflective emissive region and an adjacent diffusely reflective inactive region; and an antireflection stack adjacent the top surface. The antireflection stack includes an absorptive polarizer disposed adjacent the top surface; a reflective polarizer disposed between the top surface and the absorptive polarizer, the fast axis of each polarizer in alignment; and a retarder disposed between the top surface and the reflective polarizer, the fast axis of the retarder aligned at an angle to the fast axis of the polarizers. In another aspect, the present disclosure provides a pixelated display that includes at least one of the display elements.

In another aspect, the present disclosure provides a display element that includes an organic light emitting diode (OLED) having a top surface having a diffusely reflective emissive region and an adjacent diffusely reflective inactive region; and an antireflection stack adjacent the top surface. The antireflection stack includes an absorptive polarizer disposed adjacent the top surface; a reflective polarizer disposed between the top surface and the absorptive polarizer, the fast axis of each polarizer in alignment, and the reflective polarizer being spaced a separation distance of greater than 10 microns from the top surface; and a retarder disposed between the top surface and the reflective polarizer, a retarder fast axis aligned at an angle to the fast axis of the polarizers. In yet another aspect, the present disclosure provides a pixelated display that includes at least one of the display elements.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein:

FIG. 1B shows a schematic view display element including an antireflection stack;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
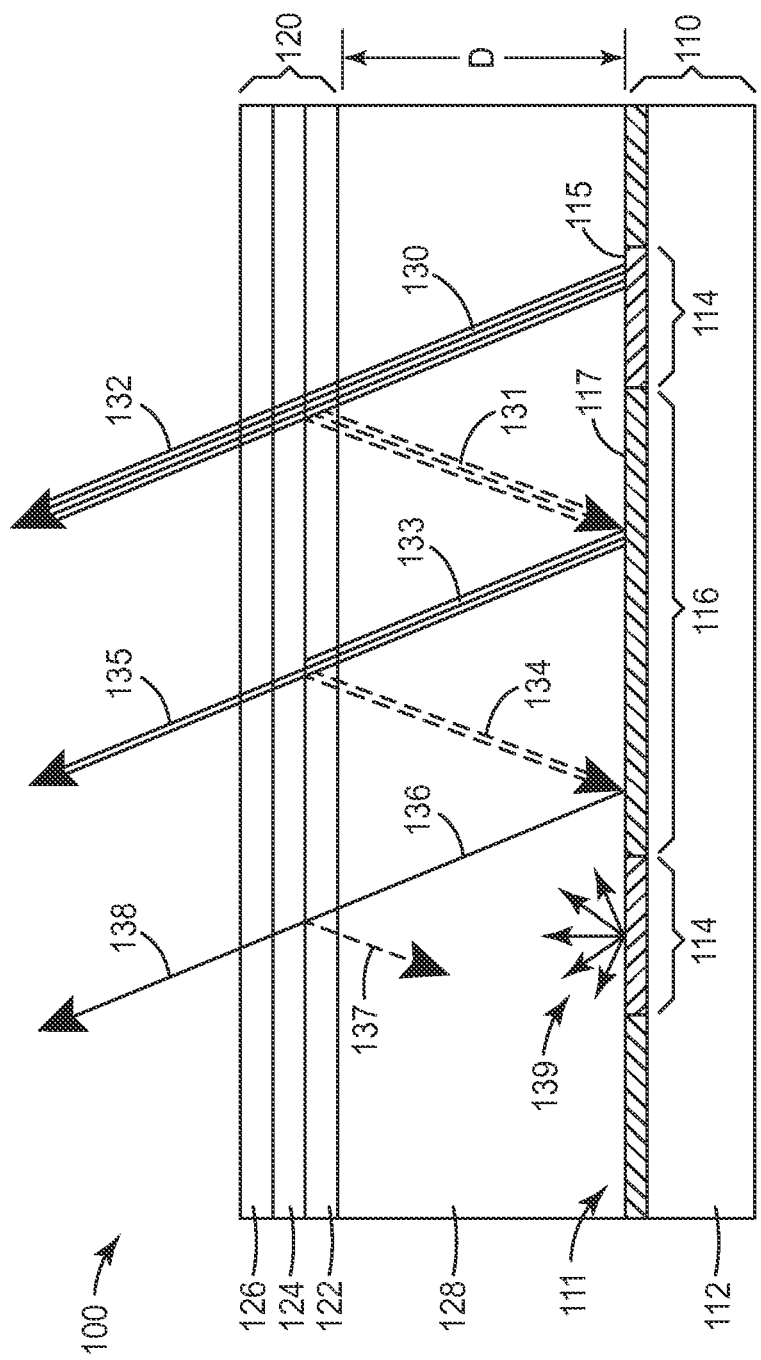
FIG. 1A shows a schematic view of display element including an antireflection stack.

The present disclosure provides an antireflection stack including a reflective polarizer added the between a quarter-wave retarder and an absorbing polarizer. Typical antireflection film stacks for an emissive display comprise a quarter-wave retarder (QW) positioned below an absorbing polarizer (AP), where the fast axis of the QW and the pass axis of the AP are oriented at about 45-degrees relative to one another. The reflective polarizer (RP) is positioned between the AP and QW, where the RP pass axis is aligned with the AP pass axis. The antireflective film stack works best with a display emission surface and inactive surface having diffusely reflective characteristics, and a substrate thickness that separates the antireflection stack from the emissive surface such that the desired emitted brightness gain is balanced against acceptable levels of ambient light reflectance and image blurring.

In some embodiments of the present disclosure, the luminance efficiency increase of the emissive display relative to one with a conventional circular polarizer may be up to 1.3; in other embodiments, the luminance efficiency increase of the emissive display relative to one with a conventional circular polarizer may be up to 2.0. In other embodiments of the present disclosure, the luminance efficiency increase of the emissive display relative to one with a conventional circular polarizer may be up to 4.0. These gains in luminance efficiency are achieved while still reducing glare caused by ambient light compared to an emissive display with no anti-reflection film.

This enhanced antireflection stack can perform well in commercial OLED displays, with a 20% or greater brightness gain, a 30% or greater ambient light reflectance gain and no visually apparent image degradation. Surprisingly, the inventors have discovered the absence of visually apparent image degradation (i.e., pixel blur, or ghost images) when using the enhanced antireflection stack. Previously, image degradation was expected, and techniques to avoid the image degradation included minimizing the separation between the emissive surface and the antireflective stack, because the emitted light gain necessarily involves cyclical reflected images. These cyclical reflected images result from the source pixel reflections between the reflective polarizer and the emitter plane (i.e., a "hall of mirrors" effect). Therefore, any displacement of these reflected images from the originating source pixel was previously expected, and could contribute to ghost images and line broadening. In one particular embodiment, the resolution of the display can be substantially degraded when the thickness of the display exceeds the pixel dimension in at least one in-display plane direction. In another particular embodiment, the degradation of the resolution of the display can be avoided while increasing the thickness of the display to several times the pixel dimensions.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The term "OLED" refers to an organic light emitting device. OLED devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

The phrase "polarization preserving element", such as a "polarization preserving diffuse reflector", defined here, is a bulk optic, coating, or film that does not depolarize an incident polarized beam of light, but instead can convert or alter the polarization of a portion of an incident polarized beam of light, such as, for example, changing the direction of circularly polarized light reflected from a reflector. The portion may be selected spatially, angularly, or by wavelength and may be part or the entire incident beam. Polarization preserving elements may include optical retarder films or coatings, surface scattering or diffusing films or coatings, heterogeneous coatings containing form birefringent or molecularly birefringent domains such as liquid crystals, polymer liquid crystals, or other polarizable polymers, and metamaterials containing mixed orientation domains of birefringent media.

FIG. 1A shows a schematic view of a display element 100 including an antireflection stack 120, according to one aspect of the disclosure. The antireflection stack 120 is disposed adjacent an organic light emitting diode (OLED) 110. The OLED 110 includes a support substrate 112 and has a top surface 111 that is adjacent the antireflection stack 120, and separated a separation distance "D" from the antireflection stack 120. The top surface 111 of the OLED includes diffusely reflective emissive regions 114 and adjacent diffusely reflective inactive regions 116. In some cases, display element 100 can include only one diffusely reflective emissive region 114 and one diffusely reflective inactive region 116; however, typical display elements will include a plurality of diffusely reflective emissive regions 114 separated by diffusely reflective inactive regions 116. In some cases, the diffusely reflective inactive regions 116 can include, for example, a black matrix that covers the circuitry and other driving components used to activate or address the diffusely reflective emissive regions 114, as known in the art.

The antireflection stack 120 includes an absorptive polarizer 126 disposed adjacent the top surface 111, and a reflective polarizer 124 disposed between the top surface 111 and the absorptive polarizer 126. The reflective polarizer 124 and the absorptive polarizer 126 are disposed such that the "fast axis" (or alternately the "pass axis") of each polarizer is aligned. In this manner, light having a first polarization state can pass through both the absorptive polarizer 126 and the reflective polarizer 124; however, light having the orthogonal second polarization state is absorbed by the absorptive polarizer 126 and reflected by the reflective polarizer 124. The antireflection stack 120 further includes a retarder, such as a quarter-wave retarder 122 disposed between the top surface 111 and the reflective polarizer 124. The "fast axis" (or alternately the "pass axis") of the quarter-wave retarder 122 is aligned at an angle to the "fast axis" (or alternately the "pass axis") of both the reflective polarizer 124 and the absorptive polarizer. For brevity in what follows, both the reflective polarizer 124 and absorptive polarizer 126 are aligned such that p-polarized light can pass through each of the polarizers, although it is to be understood that the display element 100 functions in a similar manner if the polarizers are aligned such that s-polarized light passes through.

The separation distance "D" can generally include a glass or a polymeric sheet that may serve to protect the OLED 110 from the environment. Typically, a glass sheet is used to protect the moisture and oxygen sensitive OLED, and the antireflection stack 120 is deposited or affixed on this glass sheet. The separation distance "D" typically is defined as the thickness of this glass sheet plus any separation distance of the glass sheet from the top surface 111 of the OLED. In one particular embodiment, the separation distance "D" can be measured from the top surface 111 of the OLED to the reflective polarizer 124. The separation distance "D" can be any distance ranging, for example, from 10 microns to 100 microns or more, and the associated image quality (e.g., brightness and sharpness of the image) can be optimized by adjusting the reflectance characteristics of the top surface 111, as described elsewhere.

In one particular embodiment, reflective polarizer 124 is selected to efficiently split light of different polarizations over a wide range of angles of incidence. A polymeric multilayer optical film is particularly well suited for splitting light over a wide range of angles of incidence. Other reflective polarizers including MacNeille polarizers and wire-grid polarizers can be used, but are less efficient at splitting the polarized light. A MacNeille polarizer does not efficiently transmit light at high angles of incidence. Efficient splitting of polarized light using a MacNeille polarizer can be limited to incidence angles below about 6 or 7 degrees from the normal, since significant reflection of both polarization states occur at larger angles. Efficient splitting of polarized light using a wire-grid polarizer typically requires an air gap adjacent one side of the wires, and efficiency drops when a wire-grid polarizer is immersed in a higher index medium.

The reflective polarizer 124 is a Cartesian reflective polarizer film aligned to the first polarization direction. The quarter-wave retarder 122 includes a quarter-wave polarization direction that can be aligned at 45° to the first polarization direction. In some embodiments, quarter-wave polarization direction can be aligned at any degree orientation to first polarization direction, for example from 90° in a counter-clockwise direction to 90° in a clockwise direction. However, it can be advantageous to orient the retarder at approximately +/−45° as described, since circularly polarized light results when linearly polarized light passes through a quarter-wave retarder so aligned to the polarization direction. Other orientations of quarter-wave retarders can result in s-polarized light not being fully transformed to p-polarized light, and p-polarized light not being fully transformed to s-polarized light upon reflection, resulting in reduced efficiency of the antireflection stack, as described elsewhere. In some cases, the reduced efficiency can result in some decrease in the antireflective efficiency of the antireflection stack.

In the disclosure that follows with reference to FIG. 1A, the absorptive polarizer 126 and the reflective polarizer 124 are aligned to pass p-polarized light; the absorptive polarizer 126 absorbs s-polarized light and the reflective polarizer 124 reflects s-polarized light. Diffusely reflective emissive region 114 generally emits unpolarized light 139 in a wide range of angles, and is generally directed toward antireflection stack 120. For example, an unpolarized light ray 130 originating from diffusely reflective emissive region 114 passes through quarter-wave retarder 122, intersects reflective polarizer 124, and is split into an s-polarized ray and a p-polarized ray. The p-polarized ray passes through the reflective polarizer 124 and the absorptive polarizer 126 and exits the display element 100 as first p-polarized ray 132. The s-polarized ray reflects from the reflective polarizer 124 and becomes first circularly polarized ray 131 as it passes through the quarter-wave retarder 122.

In one particular embodiment, first circularly polarized ray 131 reflects from diffusely reflective inactive region 116, changing the direction of circular polarization to become second circularly polarized ray 133, and passes through quarter-wave retarder 122 becoming a second p-polarized ray 135 that exits the display element 100.

In some cases, however, the diffusely reflective inactive region 116 (and/or the diffusely reflective emissive region 114) may not be a polarization preserving reflector, and therefore the second circularly polarized ray 133 may instead be generally elliptically polarized. Upon passing though the quarter-wave retarder 122, the elliptically polarized ray 133 becomes a mixture of s- and p-polarized light that is split into a second p-polarized ray 135 that exits the display element 100, and a reflected s-polarized ray that becomes third circularly polarized ray 134 as it passes through the quarter-wave retarder 122. In this case, the third circularly polarized ray 134 again reflects from the diffusely reflective inactive region 116, changing the direction of polarization to become the fourth elliptically polarized ray 136 that passes through quarter-wave retarder 122 becoming a mixture of s-polarized and p-polarized light. The p-polarized portion passes through the reflective polarizer 124 and the absorptive polarizer 126, and exits display element as a third p-polarized ray 138. Similar reflections can continue as a result of a lack of polarization preservation; however, the relative intensity of each reflection decreases as a portion of the light exits the display element 100, as shown.

Generally, the first p-polarized ray 132 can be referred to as the primary image, the second p-polarized ray 135 can be referred to as a first secondary (or ghost) image, the third p-polarized ray 138 can be referred to as a second secondary (or ghost) image, and so on. Proper selection of the separation distance "D", and the diffuse reflection characteristics of the diffusely reflective emissive region 114 and the diffusely reflective inactive region 116 can lead to a reduction of the ghost images such that they become not visible to the human eye. In some cases, the luminous emission from the secondary images can be less than about 50 percent of the luminous emission from the primary image, or less than about 30 percent of the luminous emission from the primary image, or even less than about 20 percent of the luminous emission from the primary image.

Diffuse reflection can be altered by changing the surface texture in several different ways, including, for example, the nature of the material deposited, the method of depositing, the speed of deposition, or even by imparting a structure to the surface after formation such as by ion etching, laser ablating, mechanical polishing, and the like. In this way, any desired proportion of diffusely reflecting and specular reflecting characteristics can be imparted to the surface. In some cases, the specular component of each of the diffusely reflective emissive surface and the diffusely reflective inactive surface can range from about 20 percent to about 80 percent of the total reflectance. In some cases, the diffuse reflectance component of the total reflectance can be greater than about 20 percent of the total reflectance. In some cases, the angular distribution of reflectance can be characterized by having a half-width greater than about 10 degrees, or greater than about 5 degrees, or even greater than about 3 degrees.

FIG. 1B shows a schematic view of a display element 100 including an antireflection stack 120, according to one aspect of the disclosure. Each of the elements 110-128 shown in FIG. 1B correspond to like-numbered elements 110-128 shown in FIG. 1A, which have been described previously. In FIG. 1B, an unpolarized ambient light ray 140 enters display element 100 through antireflection stack 120. Only p-polarized ambient light passes through absorptive polarizer 126 and reflective polarizer 124, is converted to first circular polarized ambient light ray 141. The polarization preserving characteristic of the diffusely reflective emissive surface 115 and the diffusely reflective inactive surface 117 influence the subsequent path of first circular polarized ambient light ray 141 after intercepting the top surface 111, as described with reference to FIG. 1A.

In one particular embodiment, where the top surface 111 is a polarization preserving reflector, first circular polarized ambient light ray 141 intercepts top surface 111, and changes direction of circular polarization as it reflects from diffusely reflective emissive region 114 as second circular polarized ambient light ray 142. Second circular polarized ambient light ray 142 changes to s-polarized light as it passes through quarter-wave retarder 122, reflects from reflective polarizer 124, changes to second circular polarized ambient light ray 144 as it passes through quarter-wave retarder 122, and changes direction of circular polarization as it reflects from top surface 111 as third circular polarized ambient light ray 145. Third circular polarized ambient light ray 145 changes to s-polarized light as it passes through quarter-wave retarder 122, reflects from reflective polarizer 124, and so on.

In one particular embodiment, where the top surface 111 is not perfectly polarization preserving, elliptical polarization of the light can cause some of the reflected light to leak through the antireflection stack 120. In some cases, first circular polarized ambient light ray 141 intercepts top surface 111, and changes direction of elliptical polarization as it reflects from diffusely reflective emissive region 114 as second elliptical polarized ambient light ray 142. Second elliptical polarized ambient light ray 142 changes to a mixture of s-polarized light and p-polarized light as it passes through quarter-wave retarder 122. The p-polarized portion passes through the reflective polarizer 124 and absorptive polarizer 126 and exits the display element 100 as first p-polarized ambient light 143. The s-polarized portion reflects from reflective polarizer 124, changes to second circular polarized ambient light ray 144 as it passes through quarter-wave retarder 122, and changes direction of elliptical polarization as it reflects from top surface 111 as third elliptical polarized ambient light ray 145. Third elliptical polarized ambient light ray 145 changes to a mixture of p-polarized light and s-polarized light as it passes through quarter-wave retarder 122. The p-polarized portion passes through the reflective polarizer 124 and absorptive polarizer 126 and exits the display element 100 as second p-polarized ambient light 146. The s-polarized portion reflects from reflective polarizer 124, changes to third circular polarized ambient light ray 147 as it passes through quarter-wave retarder 122, and so on. Similar reflections can continue as a result of a lack of polarization preservation; however, the relative intensity of each reflection decreases as a portion of the light exits the display element 100, as shown.

The OLED can be any useful light emissive device. Considering the microcavity effect, OLEDs can be roughly categorized into two types, i.e., weak microcavity OLEDs and strong microcavity OLEDs. Conventional bottom emitting OLEDs are weak microcavity devices, while OLEDs with distributed Bragg reflectors or two metallic electrodes are considered as strong microcavity devices. Light emission properties, including the internal quantum efficiency ($\eta$int), external quantum efficiency, exciton lifetime, and angular dependence, are distinct in the two types of OLEDs due to Fabri-Perot resonant cavity effect and the Purcell effect. In many embodiments the OLED is strong microcavity OLED. In other embodiments the OLED is a weak microcavity OLED.

The linear polarizer can be any useful linear polarizer element. A linear polarizer transmits light with a single polarization state. The linear polarizer can be a wire grid polarizer or an absorptive polarizer. One useful type of absorptive polarizer is a dichroic polarizer. Dichroic polarizers are made, for example, by incorporating a dye into a polymer sheet that is then stretched in one direction. Dichroic polarizers can also be made by uniaxially stretching a semicrystalline polymer such as polyvinyl alcohol, then staining the polymer with an iodine complex or dichroic dye, or by coating a polymer with an oriented dichroic dye. These polarizers often use polyvinyl alcohol as the polymer matrix for the dye. Dichroic polarizers generally have a large amount of absorption of light.

The reflective polarizer can be any useful reflective polarizer element. A reflective polarizer transmits light with a single polarization state and reflects the remaining light. In many embodiments the reflective polarizer is a birefringent reflective polarizers. A birefringent reflective polarizer includes a multilayer optical film having a first layer of a first material disposed (e.g., by coextrusion) on a second layer of a second material. One or both of the first and second materials may be birefringent. The total number of layers may be hundreds or thousands or more. In some exemplary embodiments, adjacent first and second layers may be referred to as an optical repeating unit. Reflective polarizers suitable for use in exemplary embodiments of the present disclosure are described in, for example, U.S. Pat. Nos. 5,882,774; 6,498,683; 5,808,794, which are incorporated herein by reference.

Any suitable type of reflective polarizer may be used for the reflective polarizer, e.g., multilayer optical film (MOF) reflective polarizers; diffusely reflective polarizing film (DRPF), such as continuous/disperse phase polarizers; wire grid reflective polarizers; or cholesteric reflective polarizers.

Both the MOF and continuous/disperse phase reflective polarizers rely on the difference in refractive index between at least two materials, usually polymeric materials, to selectively reflect light of one polarization state while transmitting light in an orthogonal polarization state. Some examples of MOF reflective polarizers are described in co-owned U.S. Pat. No. 5,882,774 (Jonza et al.). Commercially available examples of MOF reflective polarizers include Vikuiti™ DBEF-D2-400 and DBEF-D4-400 multilayer reflective polarizers that include diffusive surfaces, available from 3M Company.

Examples of DRPF useful in connection with the present disclosure include continuous/disperse phase reflective polarizers as described, e.g., in co-owned U.S. Pat. No. 5,825,543 (Ouderkirk et al.), and diffusely reflecting multilayer polarizers as described, e.g., in co-owned U.S. Pat. No. 5,867,316 (Carlson et al.). Other suitable types of DRPF are described in U.S. Pat. No. 5,751,388 (Larson).

Some examples of wire grid polarizers useful in connection with the present disclosure include those described, e.g., in U.S. Pat. No. 6,122,103 (Perkins et al.). Wire grid polarizers are commercially available, inter alfa, from Moxtek Inc., Orem, Utah. Some examples of cholesteric polarizers useful in connection with the present disclosure include those described, e.g., in U.S. Pat. No. 5,793,456 (Broer et al.), and U.S. Patent Publication No. 2002/159019 (Pokorny et al.). Cholesteric polarizers are often provided along with a quarter wave retarding layer on the output side so that the light transmitted through the cholesteric polarizer is converted to linearly polarized light.

In a birefringent reflective polarizer, the refractive indices of the first layers ($n_{1x}$, $n_{1y}$, $n_{1z}$) and those of the second layers ($n_{2x}$, $n_{2y}$, $n_{2z}$) are substantially matched along one in-plane axis (y-axis) and are substantially mismatched along another in-plane axis (x-axis). The matched direction (y) forms a transmission (pass) axis or state of the polarizer, such that light polarized along that direction is preferentially transmitted, and the mismatched direction (x) forms a reflection (block) axis or state of the polarizer, such that light polarized along that direction is preferentially reflected. Generally, the larger the mismatch in refractive indices along the reflection direction and the closer the match in the transmission direction, the better the performance of the polarizer.

A multilayer optical film typically includes individual microlayers having different refractive index characteristics so that some light is reflected at interfaces between adjacent microlayers. The microlayers are sufficiently thin so that light reflected at a plurality of the interfaces undergoes constructive or destructive interference to give the multilayer optical film the desired reflective or transmissive properties. For multilayer optical films designed to reflect light at ultraviolet, visible, or near-infrared wavelengths, each microlayer generally has an optical thickness (a physical thickness multiplied by refractive index) of less than about 1 μm. However, thicker layers can also be included, such as skin layers at the outer surfaces of the multilayer optical film, or protective boundary layers (PBLs) disposed between the multilayer optical films, that separate the coherent groupings of microlayers. Such a multilayer optical film body can also include one or more thick adhesive layers to bond two or more sheets of multilayer optical film in a laminate.

In some cases, to function well for wide angle viewing of an emissive display device, a birefringent reflective polarizer maintains a high block state contrast for all angles of incidence and also maintains a high pass transmission over all angles of incidence. As it has been shown in the commonly owned U.S. Pat. No. 5,882,774, pass state transmission increases when the refractive indices of the alternating first and second layers and are matched for light polarized along the z-axis and for light polarized along the y-axis. The z-index matching also ensures that the block state transmission does not degrade at high angles of incidence. One specific useful birefringent reflective polarizer is a birefringent polymeric multi-layer polarizing film known under the trade designation "3M Advanced Polarizing Film" or "APF". U.S. Pat. No. 6,486,997, mentions the use of such a film as a PBS.

In some cases to function well for wide angle viewing of an emissive display device, the reflective polarizer has a reflectivity that generally increases with angle of incidence, and a transmission that generally decreases with angle of incidence. Such reflectivity and transmission may be for unpolarized visible light in any plane of incidence, or for light of a useable polarization state incident in a plane for which oblique light of the useable polarization state is p-polarized, or an orthogonal plane for which oblique light of the useable polarization state is s-polarized. This behavior can be desirable for some displays in order to emit more light at viewing angles more important to the display industry. This effect is called collimation. Examples of these types of films are described, for example, in U.S. Patent Application 20100165660.

Some of the advantages of the disclosed emissive displays are further illustrated by the following examples. The particular materials, amounts and dimensions recited in this example, as well as other conditions and details, should not be construed to unduly limit the present disclosure.

Examples

The system of the emissive display and antireflection stack was modeled using a modified raytrace software package, and was tested for accuracy against commercial raytrace engines such as Lighttools (available from Synopsis, Pasadena Calif.), ASAP (available from Breault Research, Tucson Ariz.), and TracePro (available from Lambda Research, Littleton Md.). The results of the modeling indicated improved gain, with reduced pixel blur in conventional OLED devices.

Model 1: Emitted Light Gain and Ambient Reflected Gain

Figure 2A:
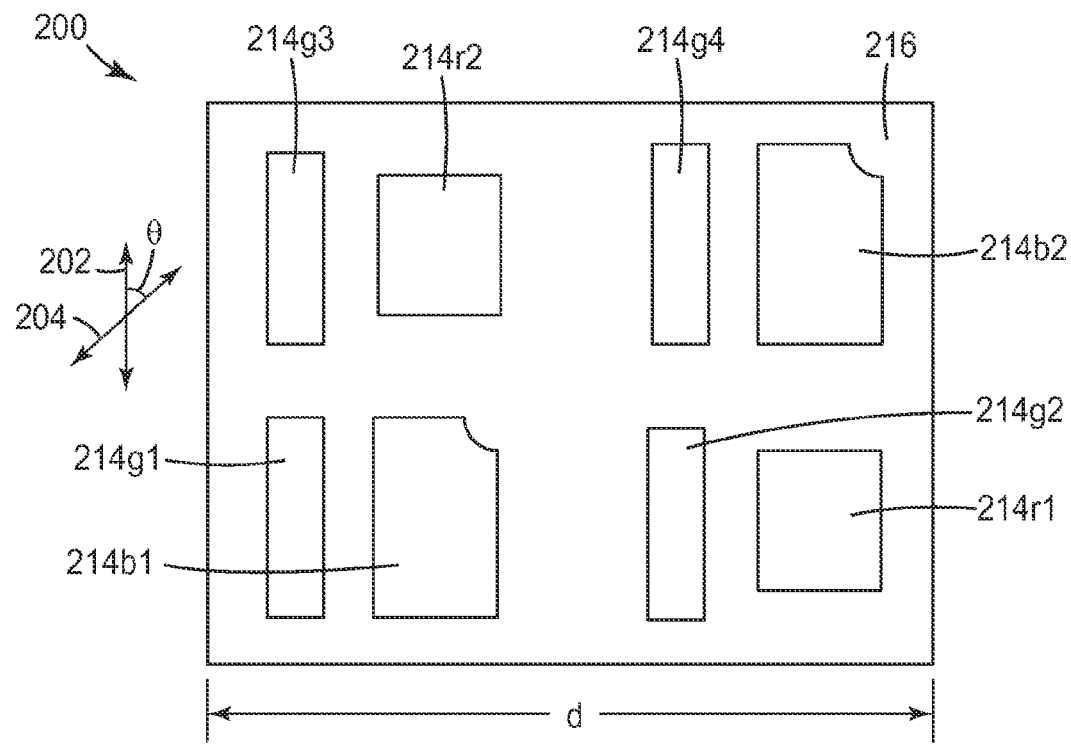
FIG. 2A shows a schematic view of an emissive display top surface pixel basis cell.

The model contained periodic boundary conditions surrounding a pixel basis cell. FIG. 2A shows an emissive display top surface pixel basis cell 200 used for the modeling. The emitter surface was comprised of 2 rows of RGBG (Red-Green-Blue-Green) color pads, the smallest repeat pattern, and a darker inactive region 216 lies between the color pads disposed on the bottom of the pixel basis cell. The first row of color pads (i.e., emissive regions) included a first green pixel 214g1, an adjacent first blue pixel 214b1, an adjacent second green pixel 214g2, and an adjacent first red pixel 214r1. The second row included a third green pixel 214g3, an adjacent second red pixel 214r2, an adjacent fourth green pixel 214g4, and an adjacent second blue pixel 214b2. The pixel basis cell 200 included a length dimension "d" of 178 microns. The pass axis 202 of both the reflective and absorptive polarizer was perpendicular to each row, and the quarter-wave pass axis 204 was disposed at an angle θ of 45 degrees. Both the inactive region and the color emitter pads were assigned a grid of reflectance values, and a photometric spectrum corresponding to a commercially available OLED display emitter plane (a Samsung Galaxy Note S2 smartphone) was traced as input emission to the model.

Simulations were performed with and without including a transmission vs. angle apodization layer to simulate a strong cavity emission profile. The phrase "transmission vs. angle apodization layer" means that in the simulations, a layer having an angular dependent transmission was added to the simulation with the angular dependence chosen so that the output from the layer is similar to the output from a strong cavity device. In some cases, apodization was included for polar angle and for color and in other cases, only apodization for polar angle was included. It was found that there was no significant difference in blurring or emissive gain caused by the apodization layer for view angles between 0 and 20 degrees. The data reported below are results from simulations that did not include an apodization layer.

The enhanced antireflection stack contained a quarter-wave retarder (QWR), a reflective polarizer (RP), and a linear absorbing polarizer (AP). The QWR was a birefringent layer of the required thickness, at 550 nm and normal incidence, to convert a linearly polarized light beam to perfect circular polarization when the fast axis of the retarder was oriented 45-degrees to the polarization direction. A comparative antireflection stack contained just the QWR and the AP in the same orientation. The optical components were optically bonded and both the enhanced and comparative stacks were optically bonded to a glass sheet, which separated the antireflection stack from the emitter surface. The data generated corresponded to simulated emitted light gain, reflected light gain, and pixel blur for a variety of both emitter and inactive surface reflectance, and separation distance of the enhanced antireflection stack from the top surface of the emitter surface. Single point data also was generated for the surface of the commercially available OLED display, which included a measured inactive region reflectance of about 0.28 and a measured emissive region reflectance of about 0.66.

Plots were generated from the data of simulated emitted light gain and reflected light gain vs. emitter surface reflectance for several separation distances. Emitted light gain is defined as the axial brightness ratio of the energized display with an enhanced antireflection stack to the energized display with a comparative stack (ambient light source is turned off). The reflective light gain is defined as the axial brightness ratio of the de-energized display with an enhanced antireflection stack to the de-energized display with the comparative antireflection stack (ambient light source turned on).

The RP reflects roughly half of the emitted light back through the QWR, which reflects from the OLED surface and returns through the QWR in the pass state of the RP. The QWR is not perfect at all angles and wavelengths, hence cyclical reflections of decreasing intensity occur. The simulated emitted light gain for the Samsung Galaxy Note S2 emitter plane ranged from about 1.5 at a separation distance of 15 microns, to a gain of about 1.2 at a separation distance of 600 microns. In a like manner, the simulated reflected light gain for the Samsung Galaxy Note S2 emitter plane remained relatively constant at about 3 for separation distances from about 15 microns to about 600 microns.

Figure 3:
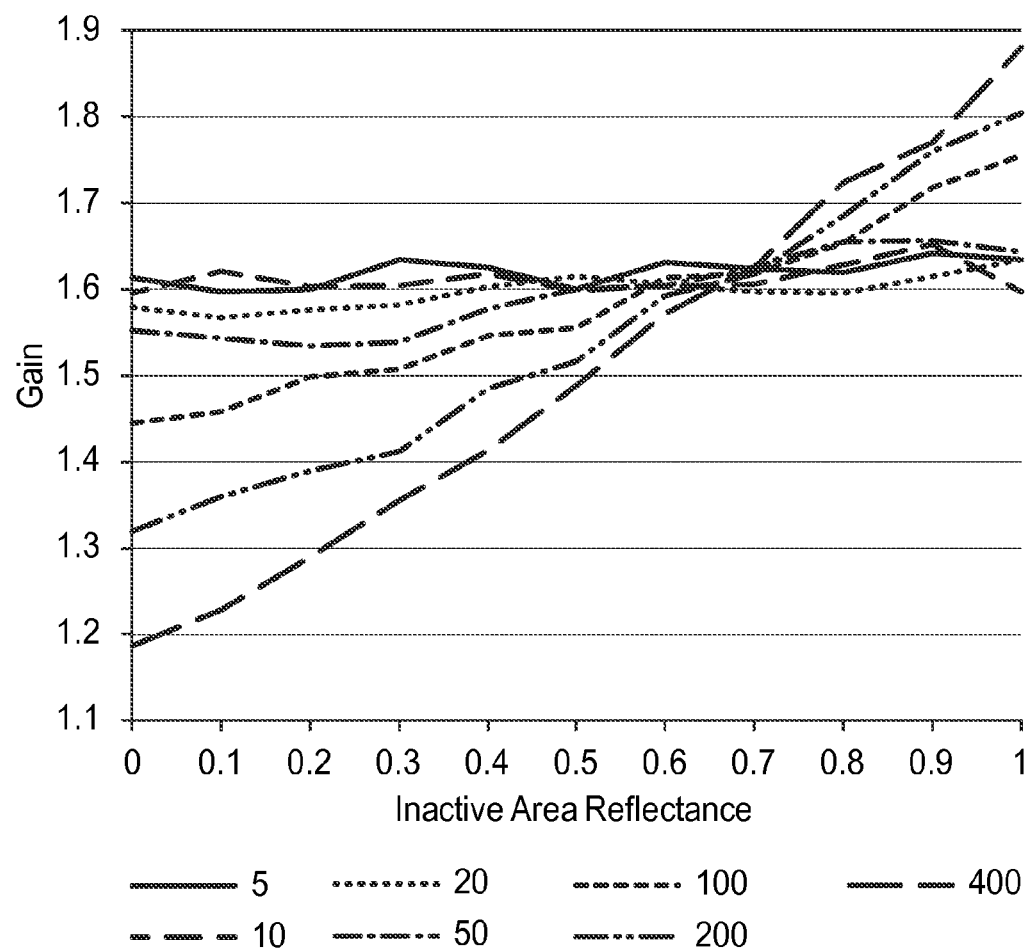
FIG. 3 shows a plot of emitted light gain vs inactive area reflectance.
Figure 4:
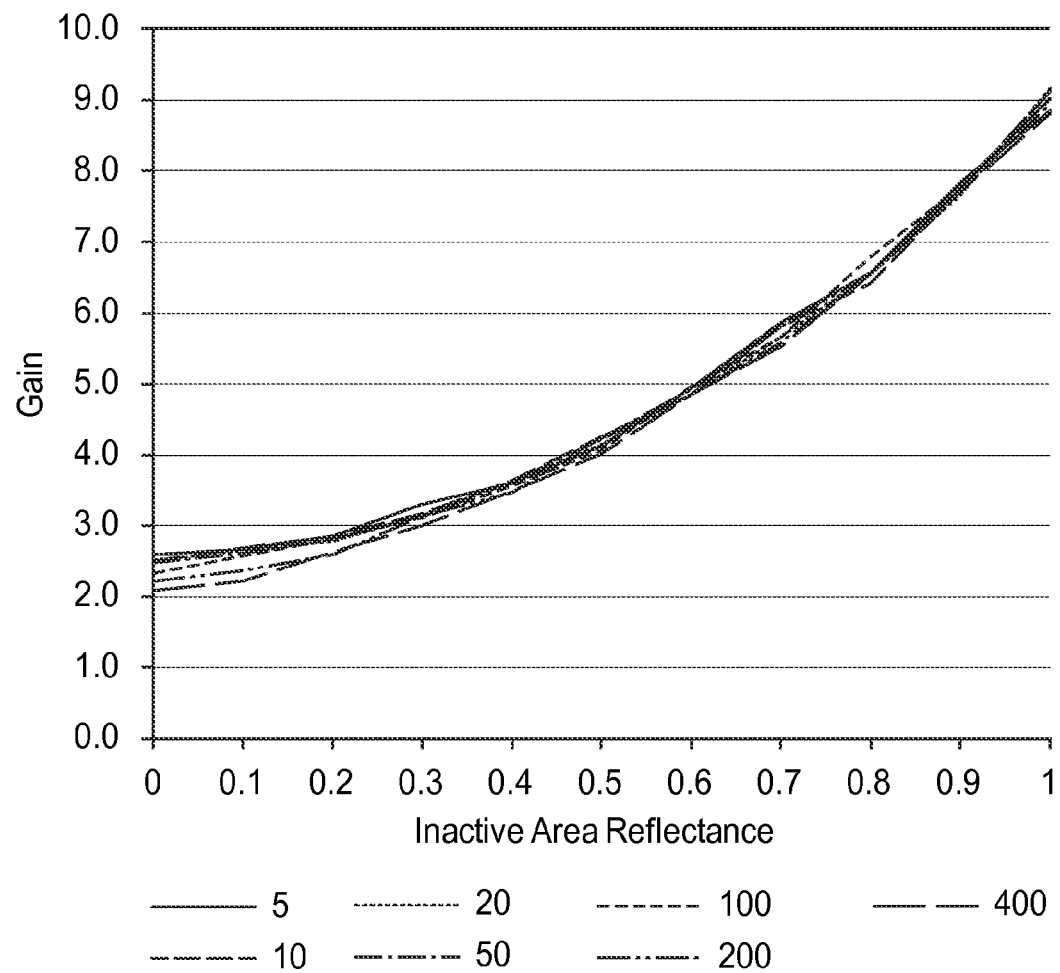
FIG. 4 shows a plot of reflected light gain vs inactive area reflectance.
Figure 5:
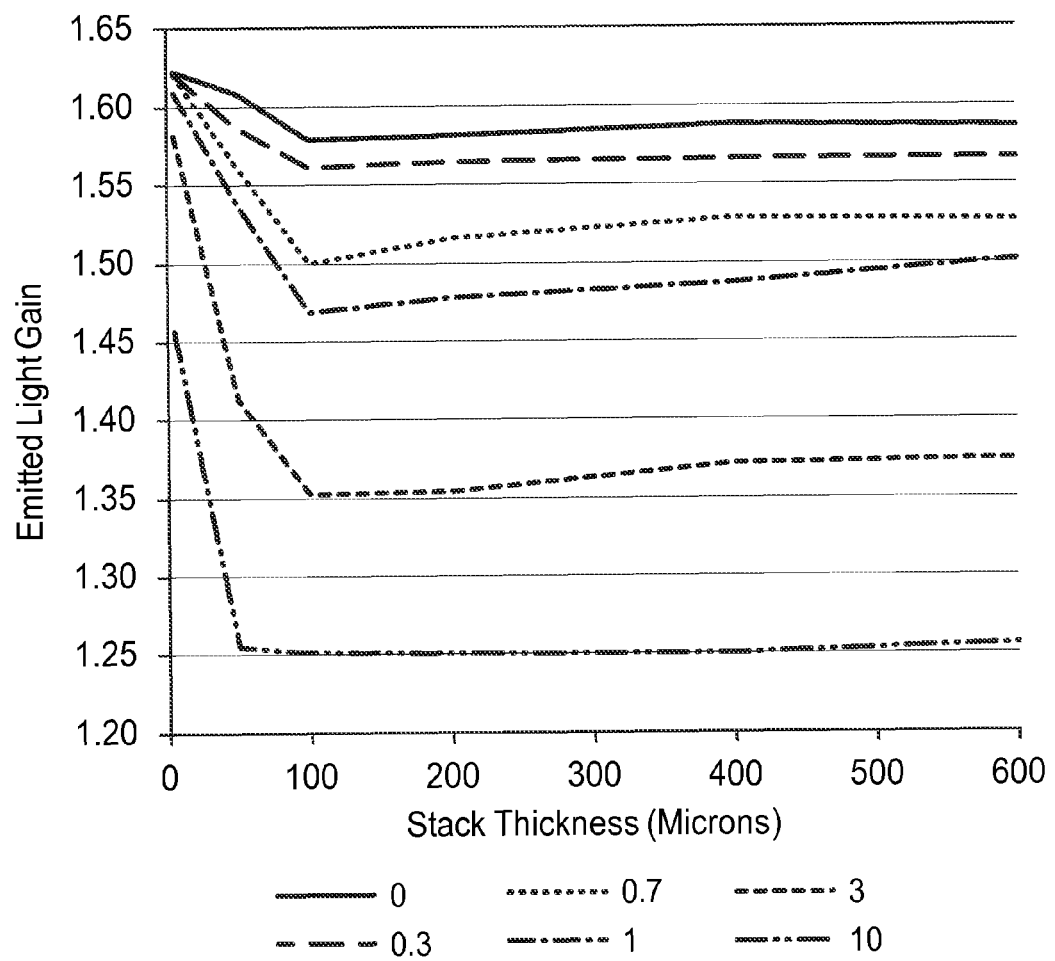
FIG. 5 shows a plot of emitted light gain vs stack thickness.
Figure 6:
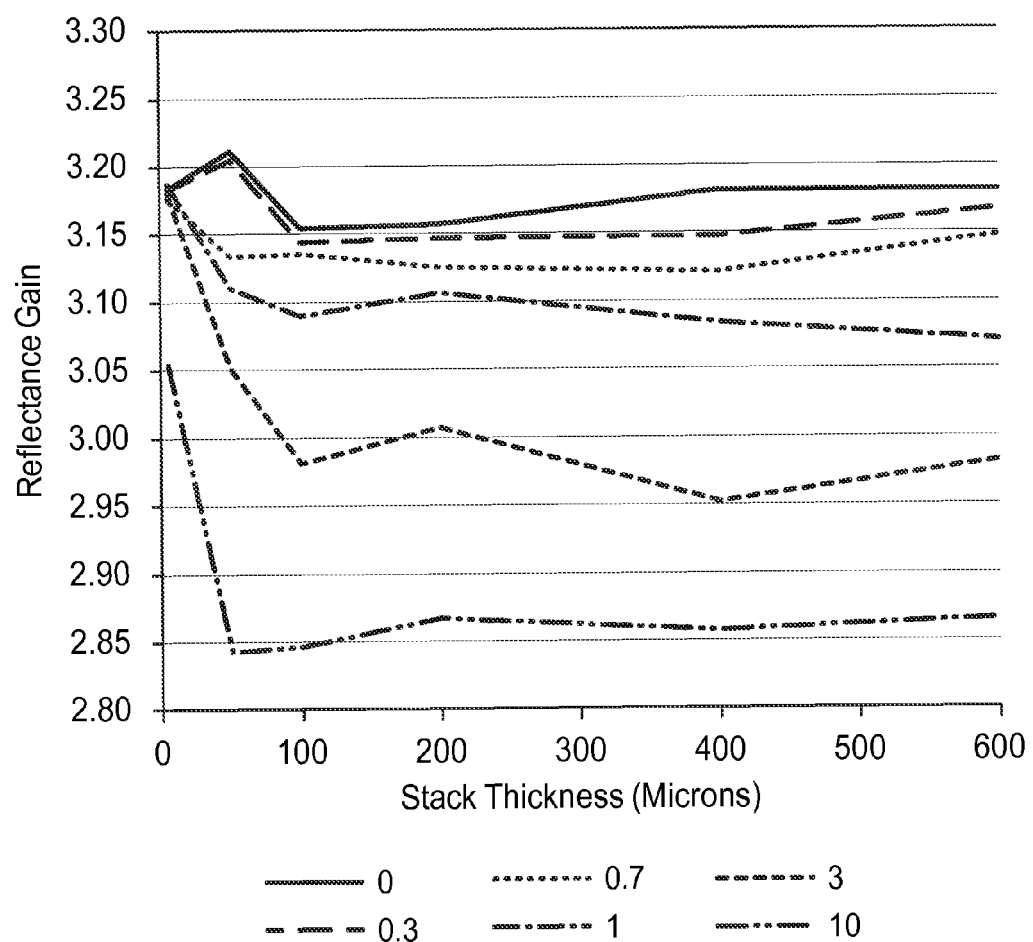
FIG. 6 shows a plot of reflected light gain vs stack thickness.

The emitted light gain is shown in FIG. 3 for an emissive region reflectance of 0.7, a "σ" value of 0.7, for stack thickness (i.e., the distance separation of the antireflective stack from the OLED top surface, "D" in FIGS. 1A-1B) ranging from 5 to 400 microns versus inactive region reflectance as shown in the Figure. The simulation included a surface roughness assigned to each of the emitter surfaces and inactive surfaces that was simulated using a Gaussian distribution of surface slopes having a standard deviation width of "σ" degrees. Generally, a larger value of "σ" corresponds to a rougher (and more diffusely reflecting) surface. All other model parameters were chosen to simulate the commercially available OLED display. The reflected gain was determined for the same range of parameters and is shown in FIG. 4. FIGS. 5 and 6 show the emitted light gain and the reflected gain, respectively, for an emissive region reflectance of 0.7, an inactive area reflectance of 0.3, for "σ" values ranging from 0 to 10 degrees versus stack thickness as shown in the Figures.

Model 2: Image Quality Simulation

Figure 2B:
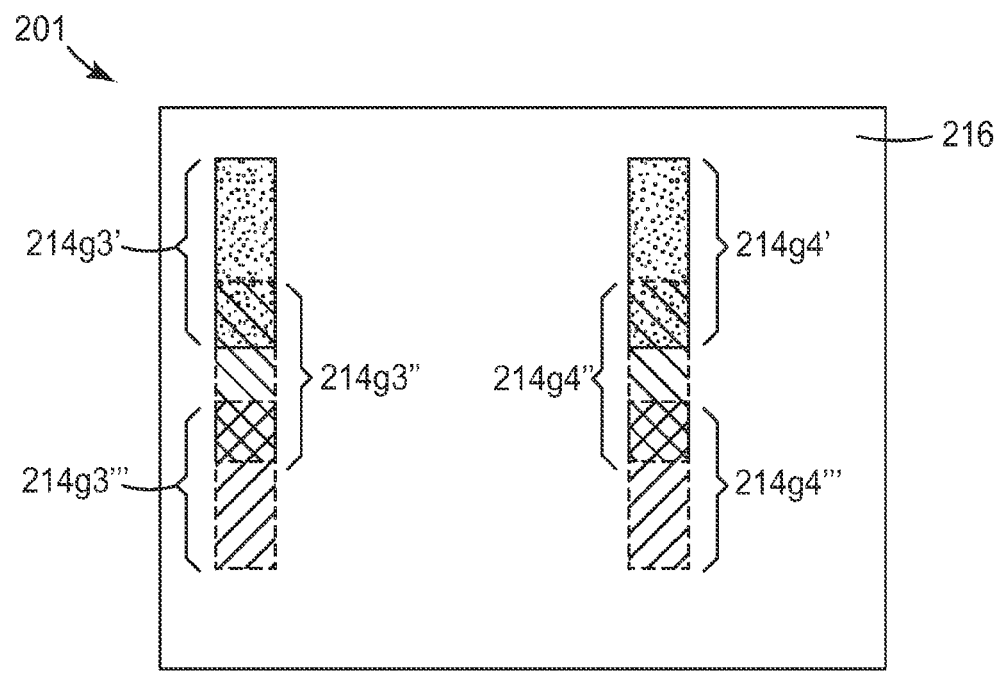
FIG. 2B shows a schematic of pixel blur from an emissive display.

FIG. 2B shows a schematic of pixel blur 201 from the emissive display top surface pixel basis cell 200 of FIG. 2A, according to one aspect of the disclosure. In FIG. 2A, second row green pixels third green pixel 214g3 and fourth green pixel 214g4 are activated, and representative pixel blur is illustrated. Third green pixel 214g3 produces a primary third green pixel image 214g3', a first secondary third green pixel image 214g3", and a second secondary third green pixel image 214g3'''; the brightness of each successive image decreases (214g3'>214g3">214g3'''), as described elsewhere. In a similar manner, second row fourth green pixel 214g4 produces a primary fourth green pixel image 214g4', a first secondary fourth green pixel image 214g4", and a second secondary fourth green pixel image 214g4'''; the brightness of each successive image decreases (214g4'>214g4">214g4'''), as described elsewhere.

A simulation was performed of a 1-dimensional array of reflective strips with 30 micron line width and 89 micron line spacing. Diffuse reflectance was modeled using the surface slope variations "σ" and an enhanced antireflective stack was modeled as in Model 1.

An eye model was used to determine the degree of ghosting. In the eye model, the distance from the eye lens to the top surface of the antireflective stack was 300 mm, the distance from the lens to the retina was 25 mm (magnification=1/12) and the iris diameter was 5 mm. Since the eye model magnification was 1/12, the 89-micron OLED pixel imaged at the retina was 7.4 microns wide. The model used reverse ray trace from a retina image spot to an OLED object spot and the retina image was built by moving the image spot a small distance and repeating the ray trace.

A peak brightness merit function was calculated as follows. The peak luminosity of the primary peak and the reflected peak, $R_{peak}$, were determined for view angles of 10, 15 and 20 degrees, for "σ" values of 0, 1, 3, and 10 degrees, for stack thickness of the film stack of 10, 50, 200 and 600 microns, and for each of the emissive region reflectance and inactive region reflectance varied from 0 to 1, inclusive, in 0.1 increments. The reflectance peak was summed over each of the three view angles. This provided a view-angle summed reflectance peak for each of the 1936 total combinations of "σ", thickness and reflectance considered. The maximum value, $R_{max}$, of the view-angle summed reflectance peak over these 1936 conditions was determined. The reflected image peak merit function for each of the 1936 conditions was determined as the view-angle summed reflectance peak divided by the maximum value, $R_{max}$.

Plots of the reflectance peak were generated from the data for standard deviation widths of "σ"=0 degrees, 0.3 degrees, and 0.7 degrees, and for separation distances from 100 microns to 700 microns. The results indicated that the separation distance had little effect on the ghost image brightness, a small amount of increase in surface roughness significantly reduced the peak image brightness, and the inactive region attenuated the ghost reflection peak.

The peak brightness metric can be important, because a broadened ghost image may be diluted below the detectable limit. However, the brightness only affects the image quality if it broadens the minimum line width—otherwise, it simply brightens the primary image. Thus, the spatial displacement of the reflected image from the primary image can be an important factor in the image quality.

The reflectance moment takes into account both the peak brightness and its displacement from the primary image. The peak brightness and the reflectance moment metric taken together provide a more complete picture of image quality. A reflectance moment merit function was calculated in a manner similar to the peak brightness merit function. A view-angle summed reflectance moment for each of the 1936 conditions was determined and the results were normalized by dividing by the maximum value of the view-angle summed reflectance moment. The reflectance moment for a given view angle and for a given set of conditions was determined as follows. The reflected luminance was determined as a function of a coordinate x defined by dividing the coordinate of the retina image spot in the eye model by the lens magnification factor of 1/12. The x coordinate determined in this way approximated the distance along the OLED surface since the cosines of the view angles considered in the model were not very different from unity. A point x0 was determined as the value of the x coordinate where the primary image peak was half of its maximum value. The reflected image moment for a given view angle and for a given set of conditions was calculated as the integral over x of the reflected luminance of the ghost image times the distance x–x0.

Plots of the reflectance moment were generated from the data for standard deviation widths of "σ" 0 degrees, 0.3 degrees, and 0.7 degrees, and for separation distances from 100 microns to 700 microns. The results indicate that the Samsung Galaxy Note S2 emitter plane, with the enhanced antireflection stack falls within the range of good image quality. The broadened ghost image is difficult to observe even through a microscope. In this case, the acceptable range was $R_{peak}$ less than about 0.3 and the reflectance moment less than about 0.2. The quality image range puts constraints on the black matrix reflectance, the emitter pixel reflectance, the black matrix to emitter area ratio, the substrate thickness, and the emitter surface roughness. Generally, lower reflectance, thinner substrate, and greater surface roughness are better for image quality.

Figure 7:
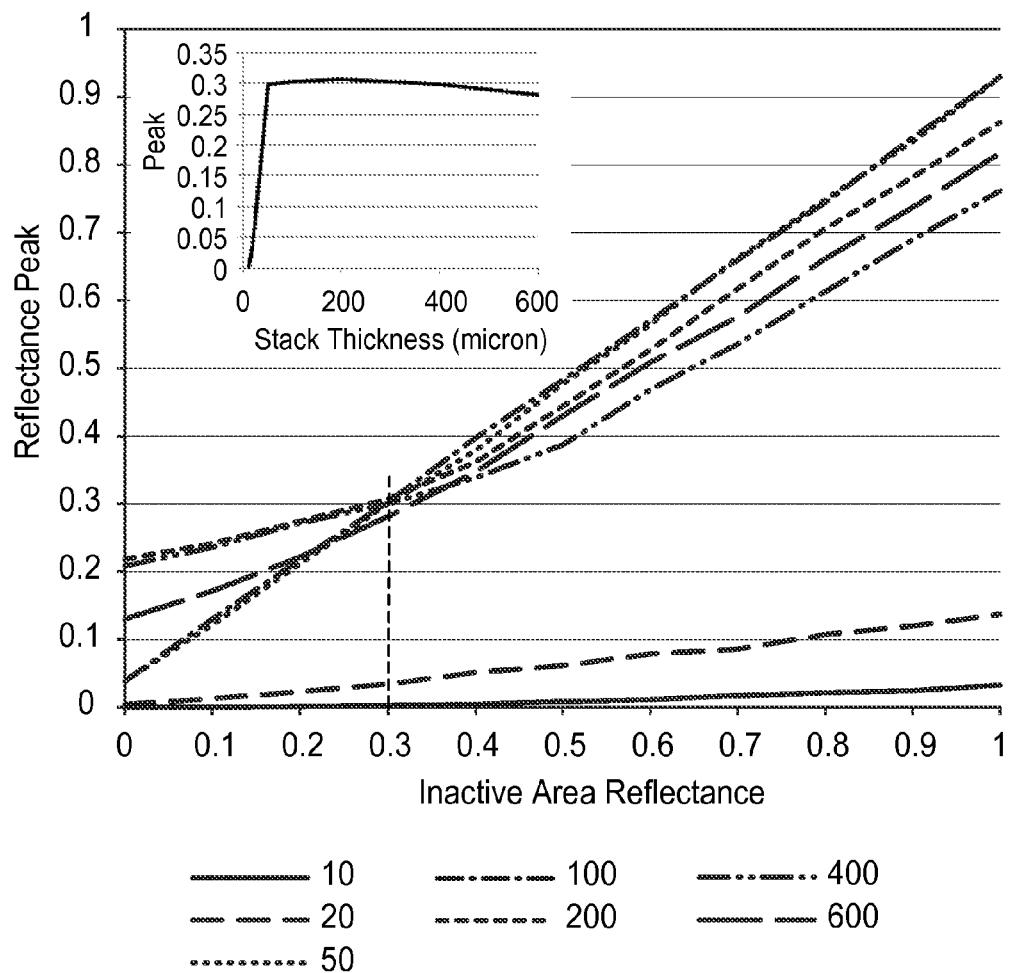
FIG. 7 shows a plot of peak brightness merit function vs inactive area reflectance.
Figure 8:
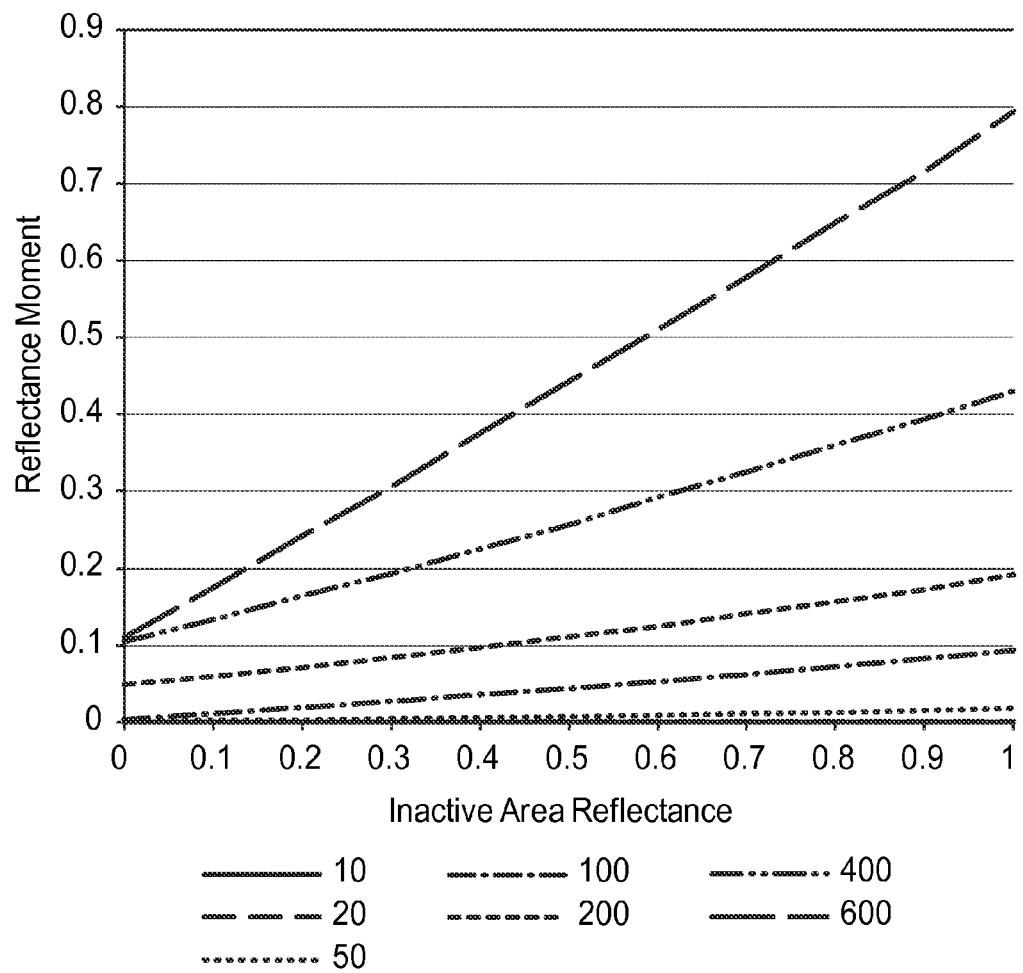
FIG. 8 shows a plot of reflectance moment merit function vs inactive area reflectance.

FIGS. 7 and 8 show the peak brightness merit function and the reflectance moment merit function, respectively, for an active area reflectance of 0.7, a "σ" value of 0.3 degrees and with stack thickness and inactive region reflectance as shown in the Figures, for stack thickness of 10, 20, 50, 100, 200, 400, and 600 microns. All other model parameters were chosen to simulate the commercially available OLED display. Similarly FIGS. 9-10, FIGS. 11-12 and FIGS. 13-14 show the peak brightness merit function and the reflectance moment merit function, respectively, for the same parameters except that the "σ" value is 1, 3, and 10 degrees, respectively.

Figure 9:
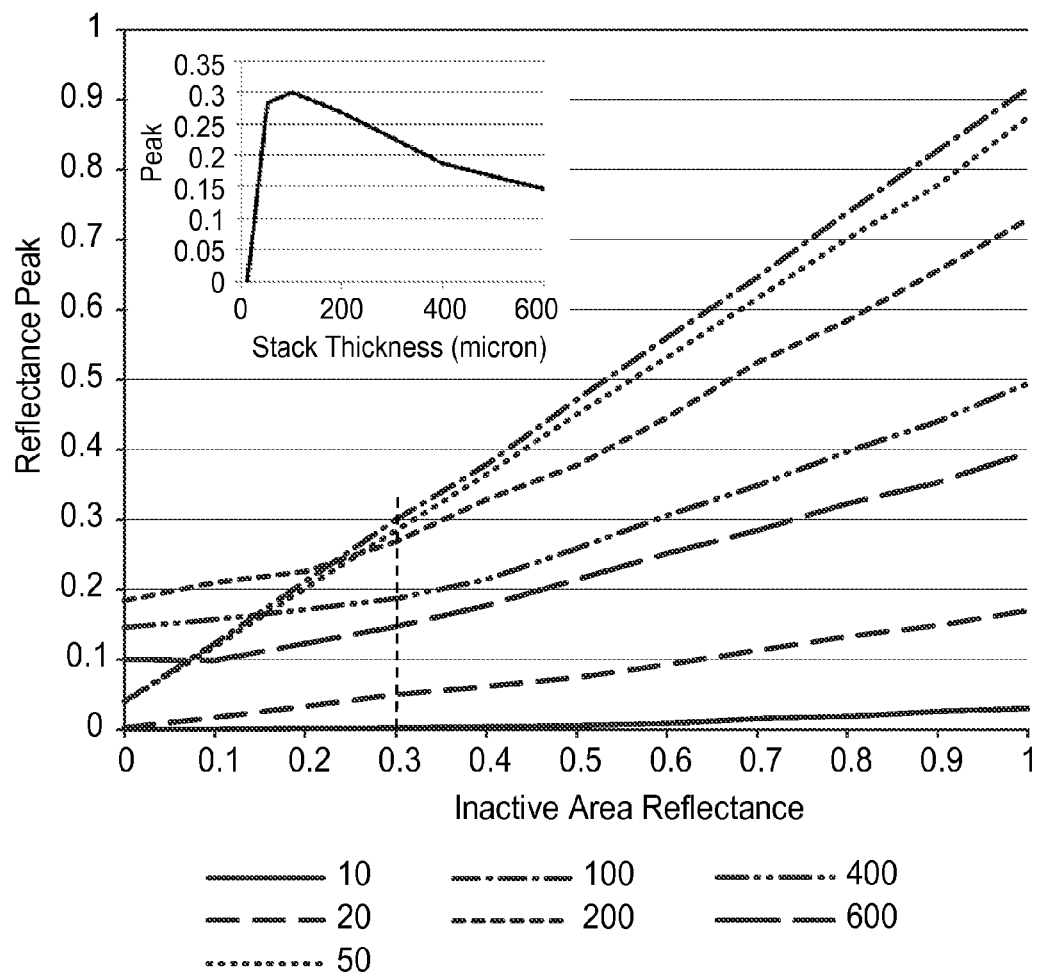
FIG. 9 shows a plot of peak brightness merit function vs inactive area reflectance.
Figure 10:
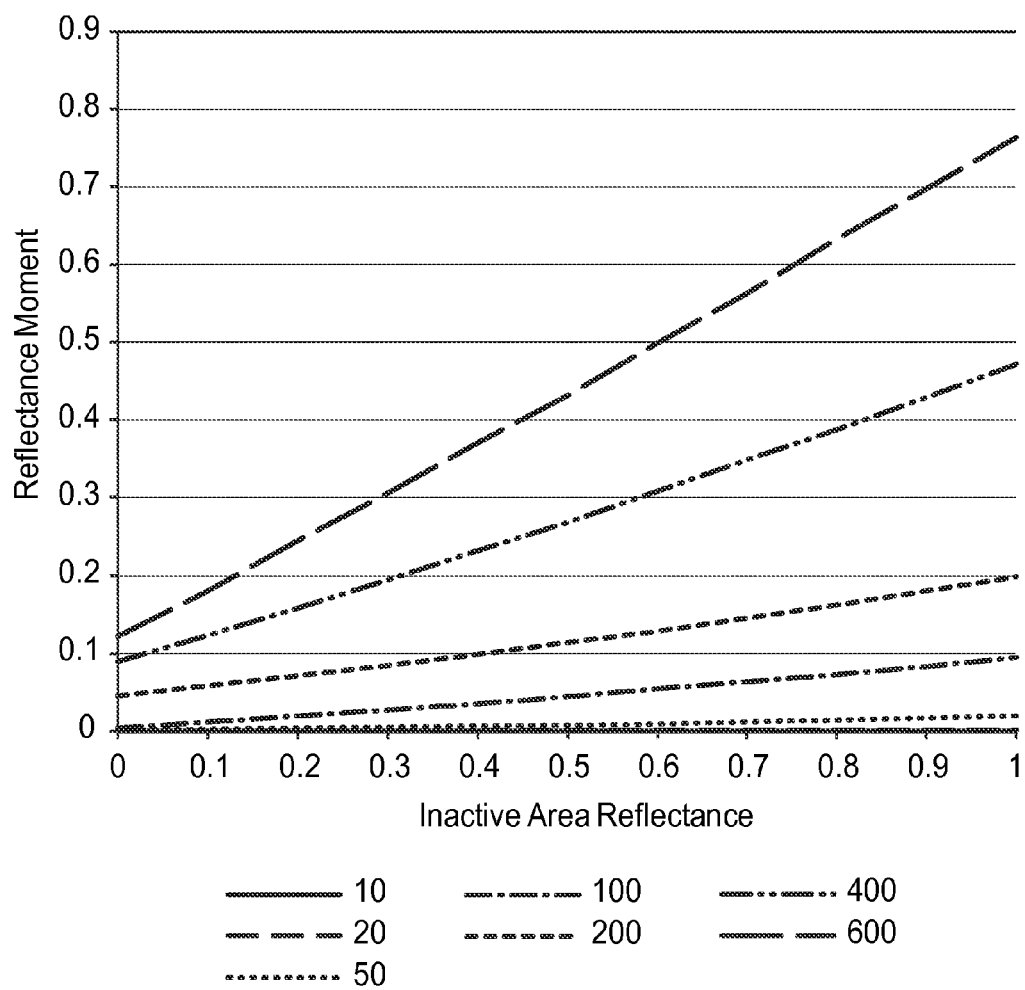
FIG. 10 shows a plot of reflectance moment merit function vs inactive area reflectance.
Figure 11:
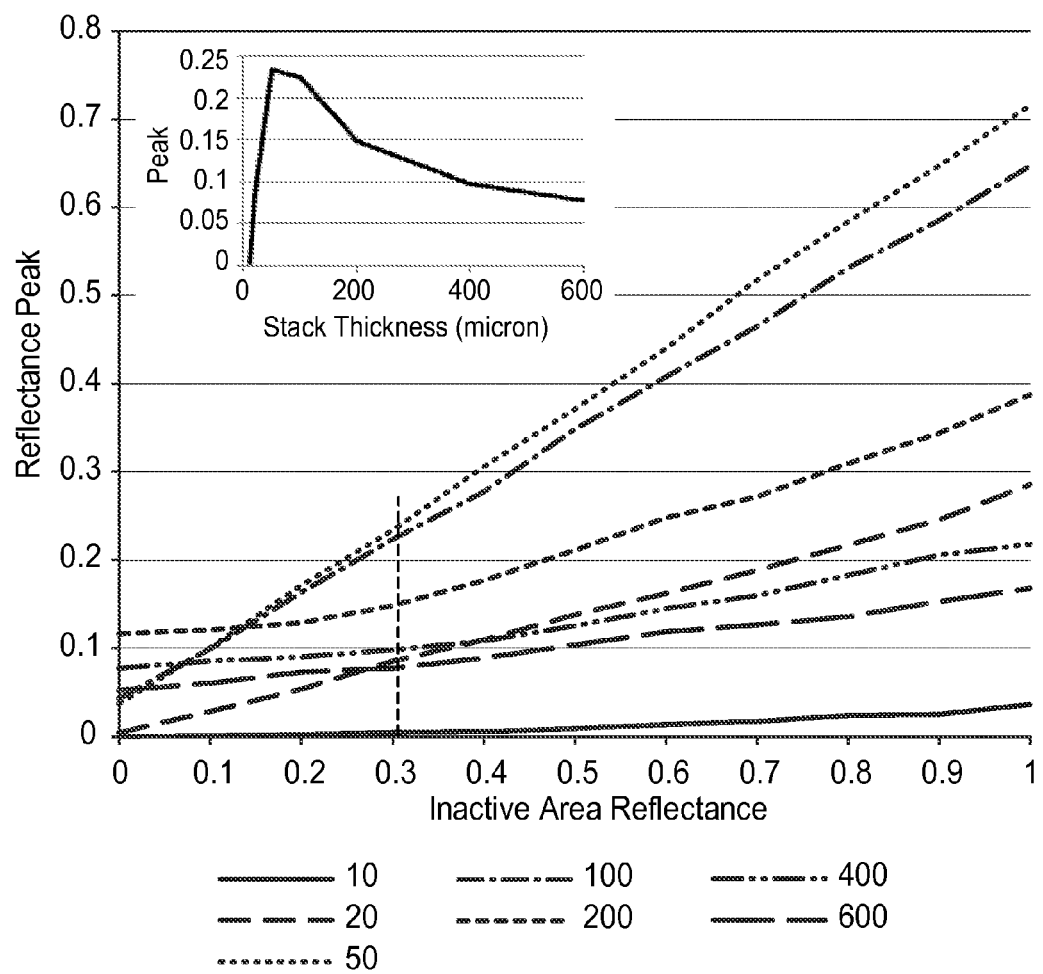
FIG. 11 shows a plot of peak brightness merit function vs inactive area reflectance.
Figure 12:
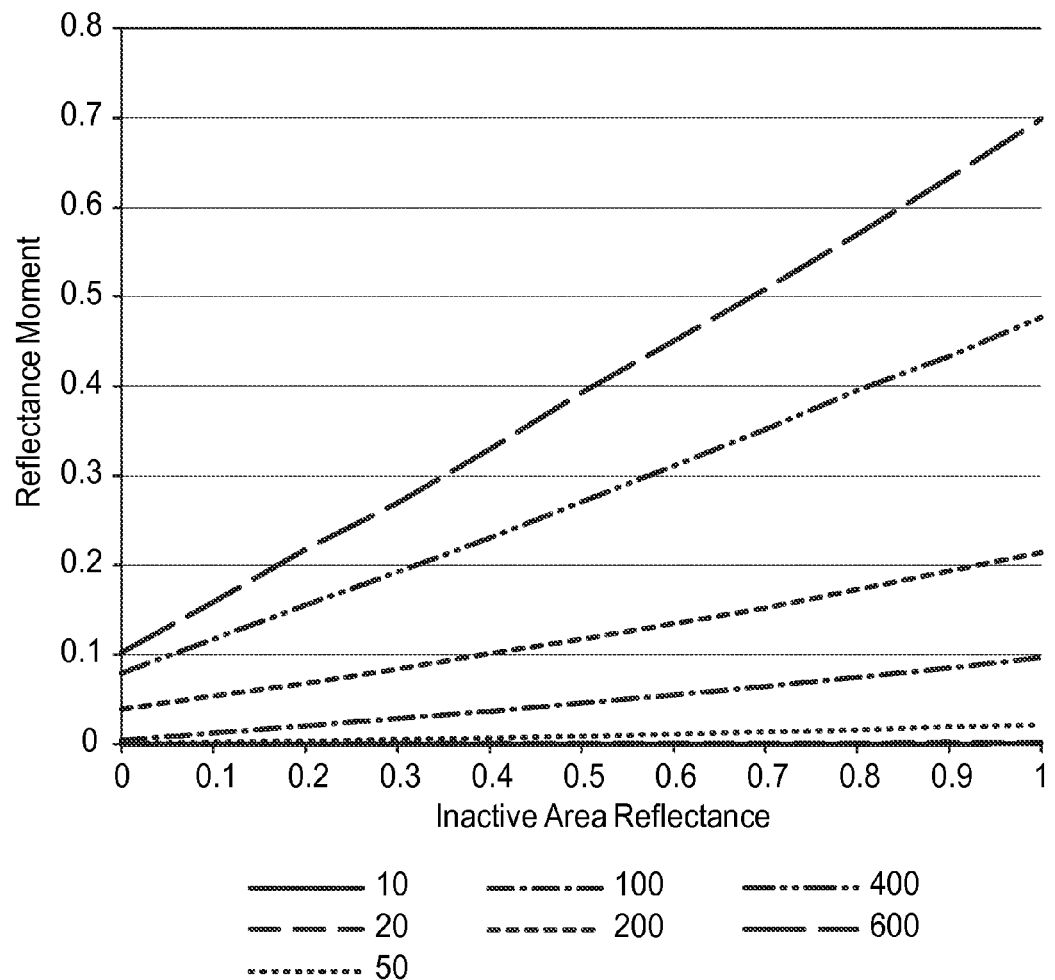
FIG. 12 shows a plot of reflectance moment merit function vs inactive area reflectance.
Figure 13:
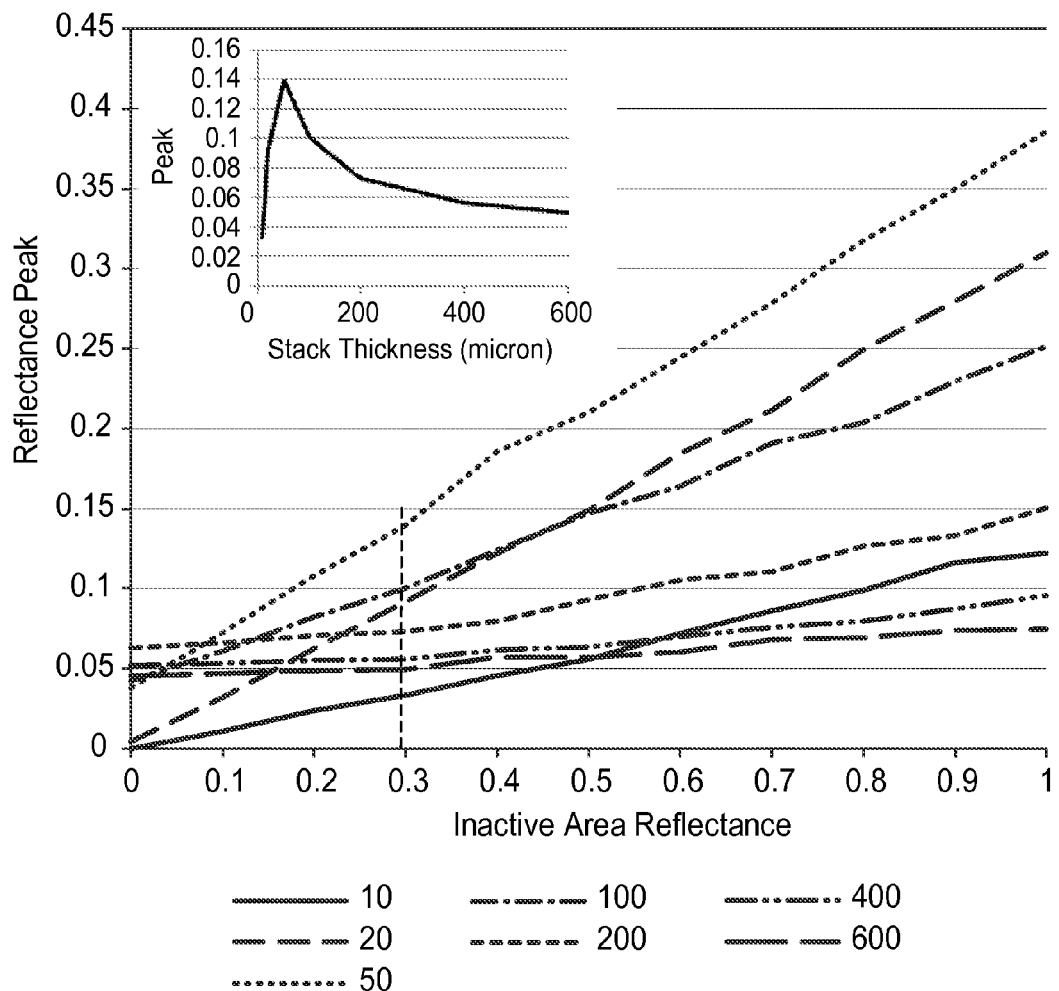
FIG. 13 shows a plot of peak brightness merit function vs inactive area reflectance.

The inset plots in FIGS. 7, 9, 11, and 13 shows the peak brightness merit function as a function of stack thickness for a fixed inactive region reflectance of 0.3, active area reflectance of 0.7 and "σ" values of 0.3, 1.0, 3.0, and 10 degrees, respectively. FIGS. 7, 9, 11, and 13 indicate that the peak brightness merit function generally increases with increasing inactive region reflectance, for stack thickness of 10, 20, 50, 100, 200, 400, and 600 microns. Each of these figures show that for stack thicknesses less than roughly 50 microns, the peak brightness merit function increases with increasing stack thickness. For larger stack thicknesses, however, FIG. 7 shows that the peak brightness merit function slowly drops off with increasing stack thicknesses for a "σ" value of 0.3 degrees. FIGS. 9, 11, and 13 show that this drop off increases with increasing "σ" values. Comparing the inset plots in FIGS. 7, 9, 11, and 13 it can be seen that the peak brightness merit function for a fixed stack thickness greater than about 50 microns decreases with increasing "σ" values.

Figure 14:
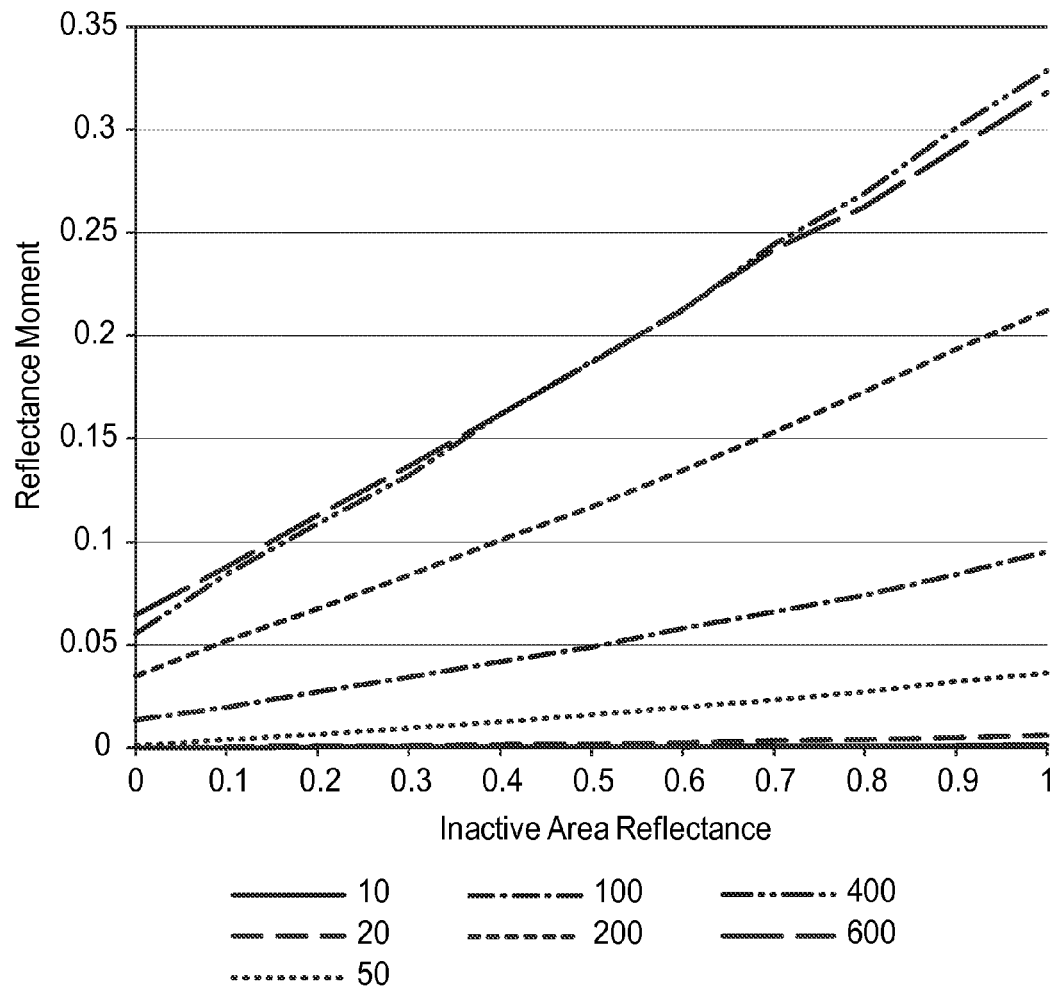
FIG. 14 shows a plot of reflectance moment merit function vs inactive area reflectance.

FIGS. 8, 10, 12, and 14 shows the reflectance moment merit function for "σ" values of 0.3, 1.0, 3.0, and 10 degrees, respectively. These figures indicate that the reflectance moment merit function generally increases with increasing inactive region reflectance and that this increase is greatest for large stack thicknesses, for stack thickness of 10, 20, 50, 100, 200, 400, and 600 microns. A comparison of the plots shown in FIGS. 8, 10, 12, and 14 show that the reflectance moment merit function depends weakly on "σ", unless "σ" is large. FIG. 14 shows that the reflectance moment merit function is significantly reduced for large stack thicknesses when "σ" is 10 degrees.

Other aspects to the display optimization are the emissive brightness gain and the ambient light reflectance gain. Both increase as the emissive surface reflectance increases. The emissive brightness increase adds value both to display quality and power efficiency. The ambient light reflectance decreases contrast. As a result, display optimization includes some balance between the emissive gain and the reflectance gain. An emissive gain greater than about 1.1 is preferred, greater than about 1.2 more preferred, and greater than about 1.3 most preferred. The brightness gain depends strongly on the separation distance of the enhanced antireflection stack from the emitter surface. Typically, the enhanced AR stack is disposed on an encapsulation glass which protects the emitter surface, and therefore the separation distance can be related to the thickness of this glass, which accounts for most of the space between the OLED surface and the reflective polarizer. Generally, the inactive region diffuse reflectance limits the gain when the spacing is thick, whereas the emitter region diffuse reflectance limits the gain when the spacing is thin. For example, the Samsung Galaxy Note S2 emitter plane with a varying separation distance changes from a brightness gain of 1.3 in the thick limit, to a brightness gain of greater than 1.5 in the thin limit.

The glass encapsulation thickness generally has little effect on the reflectance gain. The inactive region, which comprises about 75% of the surface area in the Samsung Galaxy Note S2 emitter plane, dominates the reflectance gain. For example, increasing the emitter surface diffuse reflectance to 0.8 and reducing the inactive region diffuse reflectance to 0.1, increases the emission gain to about 1.7 while holding the reflectance gain to about 3.0.

Reflectance gain can also depend upon any additional air/dielectric interfaces introduced, for example, by a protective cover plate and a touch panel. Model 1 above considered no additional interfaces above the antireflection stack. Such additional interfaces may tend to reduce the reflectance gain further, because they add relatively more light to the comparative case than to the reflective polarizer enhanced case.

Model 3: Antireflective Stack with Diffuser

Simulations similar to those described in Models 1 and 2 were preformed except that a diffuse element was placed between the quarter-wave retarder and the reflective polarizer. The diffuse element was modeled as a low index layer (n=1.5) adjacent to the quarter wave retarder and a high index layer (n=1.64) adjacent to the reflective polarizer. The interface between the high index and low index layer was modeled as having a Gaussian distribution of surface normals with standard deviations of 1, 2, 4, 10, 20 or 40 degrees.

It was found that the diffuse embedded coating significantly reduced the ghost image visibility. The primary peak width was increased, but it was still not wider than the minimum line width. The gain was approximately 1.3 with a "σ" of 40 degrees, an emissive region reflectance of 0.7, and an inactive region reflectance of 0.3.

Representative Simulation of Emissive Gain, Blur Peak, and Reflective Gain

Simulations were run to include a range of from 10 to 600 micron separation distance "D" between the top surface of the OLED and the retarder, for "σ" values of 0, 0.3, 1.0, 3.0, and 10 degrees, while varying both the inactive and active reflectance from 0 to 1 in 0.1 increments. Plots are shown for relevant parameters resulting from representative exemplary separation distances and "σ" values in FIGS. 15-17. Single point data (shown as the black dot in FIGS. 15-17) was generated for the surface of the commercially available OLED display described elsewhere, which included a measured inactive region reflectance of about 0.28 and a measured emissive region reflectance of about 0.66. Section "Model 1" contains the structure and procedure for simulations reported in FIGS. 15 and 17. Section "Model 2" describes the same for the simulated data in FIG. 16. In each of the plots, the "x" axis represents variation in the inactive area reflectance, and the "y" axis represents variation in the active area reflectance.

Figure 15:
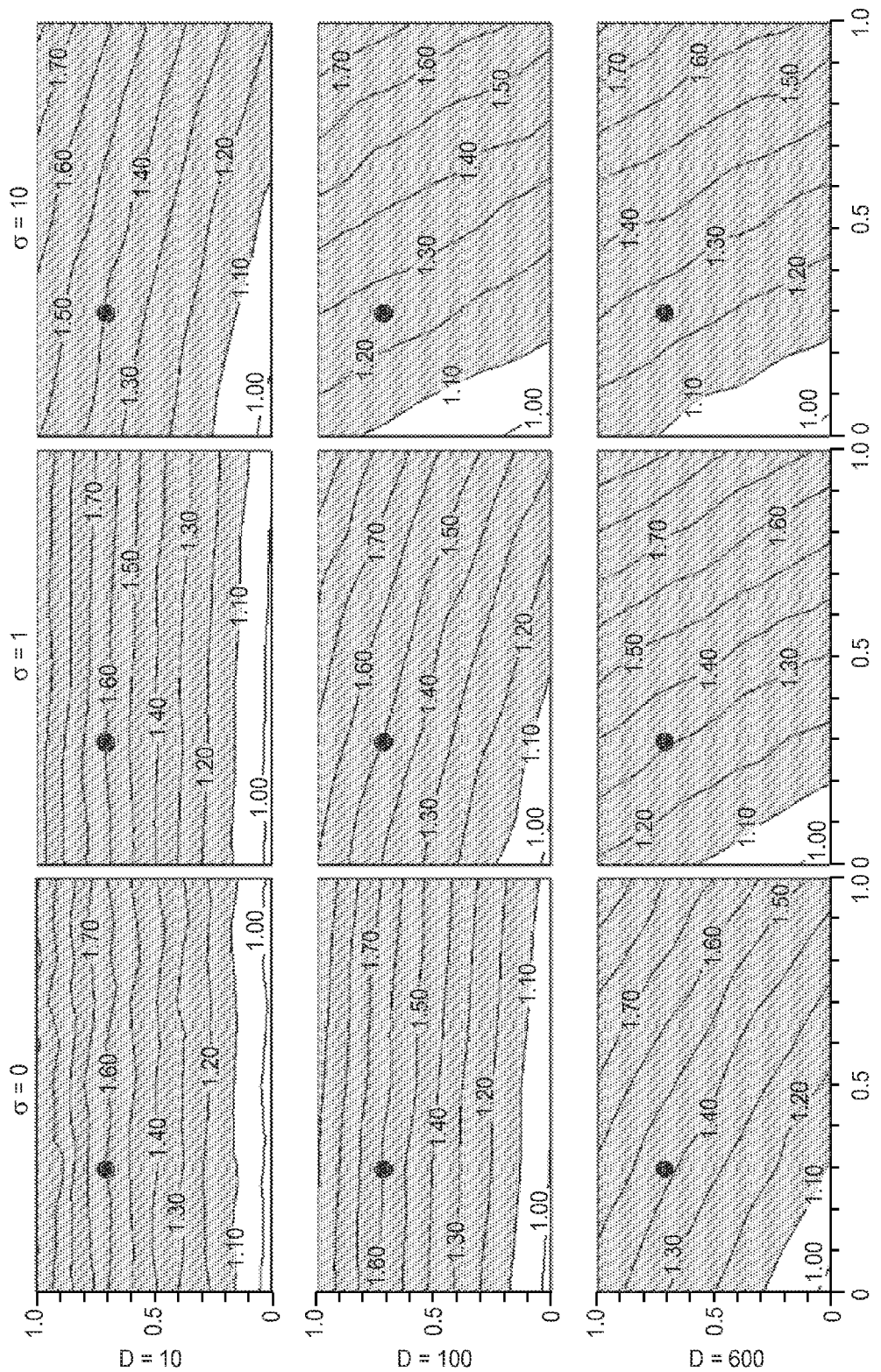
FIG. 15 shows plotted contours of the emissive gain for representative separation distances "D" and "σ" values.

FIG. 15 shows plotted contours of the emissive gain for representative separation distances "D" of 10, 100, and 600 microns, and "σ" values of 0, 1, and 10 degrees. Values of the emissive gain greater than 1.1 (i.e., a 10% increase over a device without the reflective polarizer in the CP stack) are particularly desirable to the industry, and are shown as the shaded portion of the contour plots.

Figure 16:
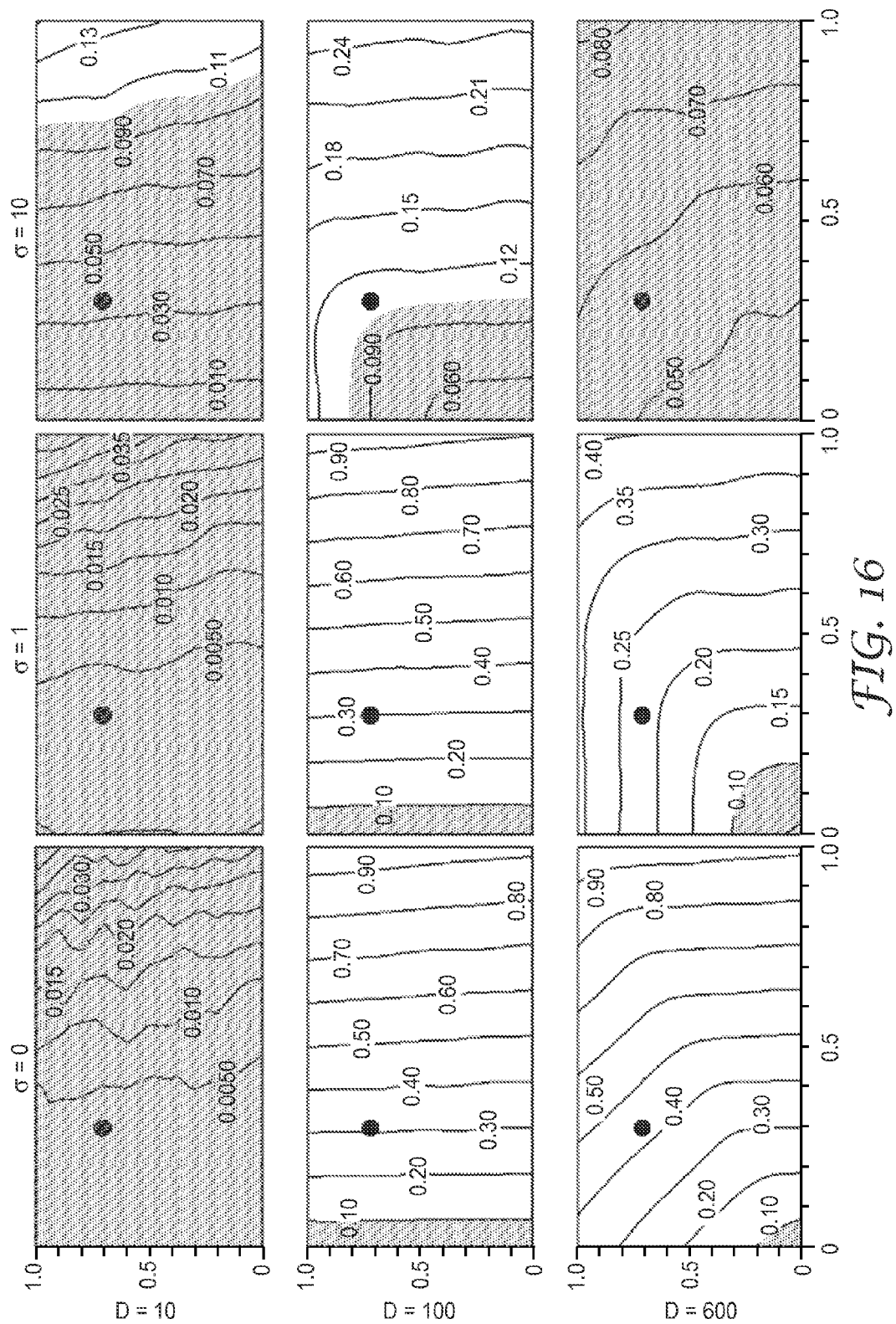
FIG. 16 shows plotted contours of the "Blur Peak" for representative separation distances "D" and "σ" values.

FIG. 16 shows plotted contours of the "Blur Peak" for representative separation distances "D" of 10, 100, and 600 microns, and "σ" values of 0, 1, and 10 degrees. The "Blur Peak" was determined by taking the average of the amplitudes of the peak of the ghost image (or reflected peak) at several viewing angles. The ghost image is spatially separated from the primary peak emission. Numerically, each of the contours represents the ratio of the blur peak to the primary peak averages over several angles. Values of the "Blur Peak" less than 0.1 are particularly desirable to the industry, and contours having these values are shown as the shaded portion of the contour plots.

Figure 17:
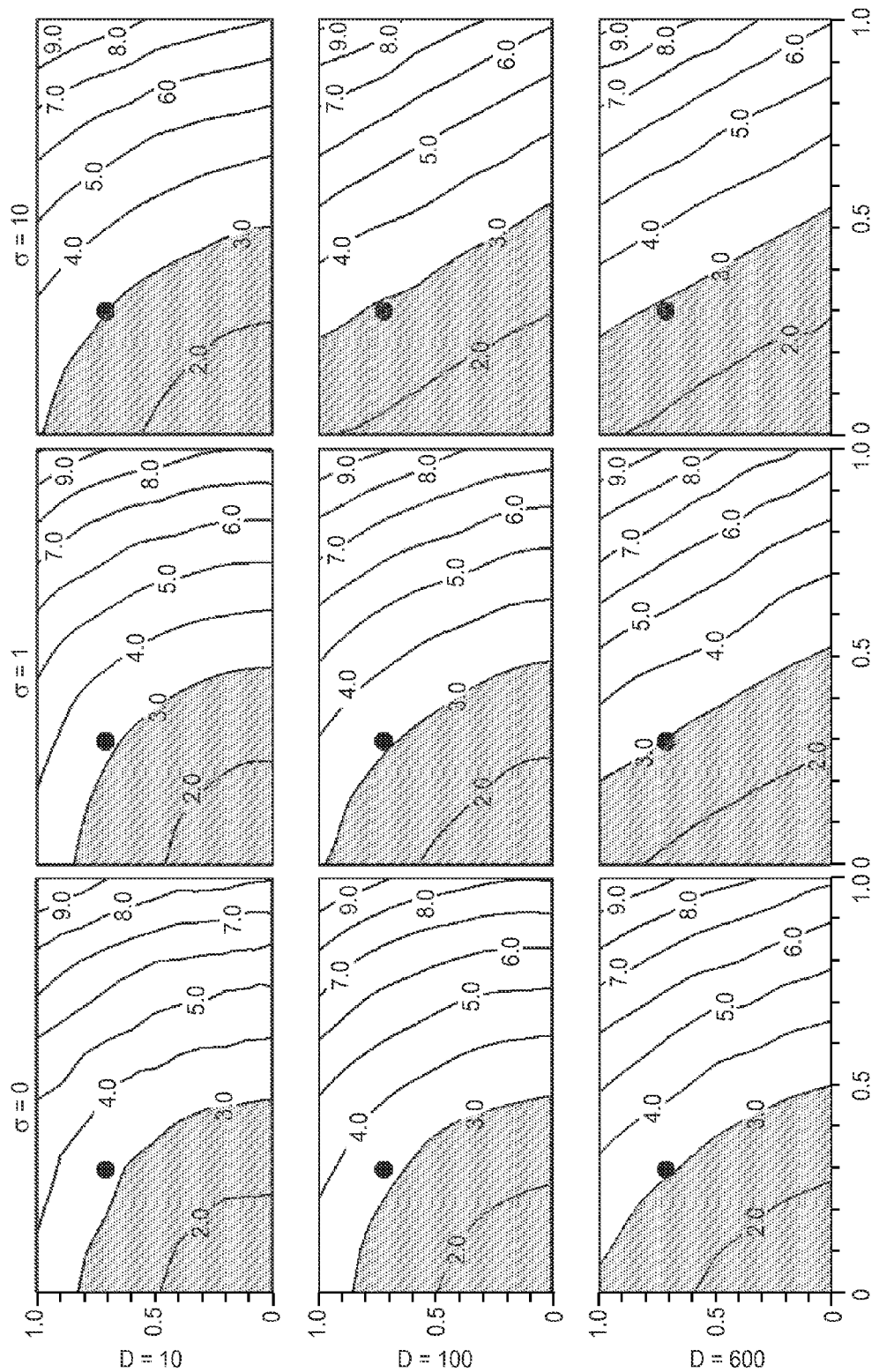
FIG. 17 shows plotted contours of the reflective gain for representative separation distances "D" and "σ" values.

FIG. 17 shows plotted contours of the reflective gain for representative separation distances "D" of 10, 100, and 600 microns, and "σ" values of 0, 1, and 10 degrees. The reflective gain was calculated as the ratio of the axial brightness of the OLED device with an enhanced CP stack (reflective polarizer in place) to the brightness with the standard CP stack (no reflective polarizer). Values of the reflective gain less than 3.0 are particularly desirable to the industry, and are shown as the shaded portion of the contour plots.

Following are a list of embodiments of the present disclosure.

Item 1 is a display element, comprising: an organic light emitting diode (OLED) having a top surface comprising a diffusely reflective emissive region and an adjacent diffusely reflective inactive region; and an antireflection stack adjacent the top surface, comprising: an absorptive polarizer disposed adjacent the top surface; a reflective polarizer disposed between the top surface and the absorptive polarizer, the fast axis of each polarizer in alignment; and a retarder disposed between the top surface and the reflective polarizer, the fast axis of the retarder aligned at an angle to the fast axis of the polarizers.

Item 2 is the display element of item 1, wherein the diffusely reflective emissive region has a first diffuse reflectance that is greater than a second diffuse reflectance of the diffusely reflective inactive region.

Item 3 is the display element of item 1 or item 2, wherein the diffusely reflective emissive region and the adjacent diffusely reflective inactive region are each substantially polarization preserving diffuse reflectors.

Item 4 is the display element of item 1 to item 3, wherein the retarder is a quarter-wave retarder having a retarder fast axis aligned at a 45 degree angle to the absorptive polarizer fast axis.

Item 5 is the display element of item 1 to item 4, wherein the diffusely reflective emissive region and the adjacent diffusely reflective inactive region are each characterized by an angular distribution of reflectance having a half-width greater than approximately 10 degrees.

Item 6 is the display element of item 1 to item 5, wherein the diffusely reflective emissive region and the adjacent diffusely reflective inactive region are each characterized by an angular distribution of reflectance having a half-width greater than approximately 5 degrees.

Item 7 is the display element of item 1 to item 6, wherein the diffusely reflective emissive region and the adjacent diffusely reflective inactive region are each characterized by an angular distribution of reflectance having a half-width greater than approximately 3 degrees.

Item 8 is the display element of item 1 to item 7, wherein the first and second diffuse reflectance are each characterized by a specular reflectance component between about 20 percent and about 80 percent of the total reflectance.

Item 9 is the display element of item 1 to item 8, wherein the first and second diffuse reflectance are each characterized by a diffuse reflectance component greater than about 20 percent of the total reflectance.

Item 10 is the display element of item 1 to item 9, wherein the first and second diffuse reflectance are each characterized by a diffuse reflectance component greater than about 30 percent of the total reflectance.

Item 11 is the display element of item 1 to item 10, wherein an emissive gain is greater than about 1.1 when compared to the OLED without the antireflection stack.

Item 12 is the display element of item 1 to item 11, wherein a separation distance between the top surface of the OLED and the retarder is greater than about 10 microns.

Item 13 is the display element of item 1 to item 12, wherein a separation distance between the top surface of the OLED and the retarder is greater than about 50 microns.

Item 14 is the display element of item 1 to item 13, wherein a separation distance between the top surface of the OLED and the retarder is greater than about 100 microns.

Item 15 is the display element of item 1 to item 14, wherein for a luminous emission from the diffusely reflective emissive region, a secondary image luminous intensity comprises less than about 50 percent of a primary image luminous intensity.

Item 16 is the display element of item 1 to item 15, wherein for a luminous emission from the diffusely reflective emissive region, a secondary image luminous intensity comprises less than about 30 percent of a primary image luminous intensity.

Item 17 is the display element of item 1 to item 16, wherein for a luminous emission from the diffusely reflective emissive region, a secondary image luminous intensity comprises less than about 20 percent of a primary image luminous intensity.

Item 18 is the display element of item 1 to item 17, having an emissive gain greater than 1.1, a blur peak less than about 0.1, and a reflective gain less than about 3.0.

Item 19 is a display element, comprising: an organic light emitting diode (OLED) having a top surface comprising a diffusely reflective emissive region and an adjacent diffusely reflective inactive region; and an antireflection stack adjacent the top surface, comprising: an absorptive polarizer disposed adjacent the top surface; a reflective polarizer disposed between the top surface and the absorptive polarizer, the fast axis of each polarizer in alignment, and the reflective polarizer being spaced a separation distance of greater than 10 microns from the top surface; and a retarder disposed between the top surface and the reflective polarizer, a retarder fast axis aligned at an angle to the fast axis of the polarizers.

Item 20 is the display element of item 19, wherein the diffusely reflective emissive region has a first diffuse reflectance that is greater than a second diffuse reflectance of the diffusely reflective inactive region.

Item 21 is the display element of item 19 or item 20, wherein the diffusely reflective emissive region and the adjacent diffusely reflective inactive region are each substantially polarization preserving diffuse reflectors.

Item 22 is the display element of item 19 to item 21, wherein the retarder is a quarter-wave retarder having a retarder fast axis aligned at a 45 degree angle to the absorptive polarizer fast axis.

Item 23 is the display element of item 19 to item 22, wherein the diffusely reflective emissive region and the adjacent diffusely reflective inactive region are each characterized by an angular distribution of reflectance having a half-width greater than approximately 10 degrees.

Item 24 is the display element of item 19 to item 23, wherein the diffusely reflective emissive region and the adjacent diffusely reflective inactive region are each characterized by an angular distribution of reflectance having a half-width greater than approximately 5 degrees.

Item 25 is the display element of item 19 to item 24, wherein the diffusely reflective emissive region and the adjacent diffusely reflective inactive region are each characterized by an angular distribution of reflectance having a half-width greater than approximately 3 degrees.

Item 26 is the display element of item 19 to item 25, wherein the first and second diffuse reflectance are each characterized by a specular reflectance component between about 20 percent and about 80 percent of the total reflectance.

Item 27 is the display element of item 19 to item 26, wherein the first and second diffuse reflectance are each characterized by a diffuse reflectance component greater than about 20 percent of the total reflectance.

Item 28 is the display element of item 19 to item 27, wherein the first and second diffuse reflectance are each characterized by a diffuse reflectance component greater than about 30 percent of the total reflectance.

Item 29 is the display element of item 19 to item 28, wherein an emissive gain is greater than about 1.1 when compared to the OLED without the antireflection stack.

Item 30 is the display element of item 19 to item 29, wherein a separation distance between the top surface of the OLED and the reflective polarizer is greater than about 50 microns.

Item 31 is the display element of item 19 to item 30, wherein a separation distance between the top surface of the OLED and the reflective polarizer is greater than about 100 microns.

Item 32 is the display element of item 19 to item 31, wherein for a luminous emission from the diffusely reflective emissive region, a secondary image luminous intensity comprises less than about 50 percent of a primary image luminous intensity.

Item 33 is the display element of item 19 to item 32, wherein for a luminous emission from the diffusely reflective emissive region, a secondary image luminous intensity comprises less than about 30 percent of a primary image luminous intensity.

Item 34 is the display element of item 19 to item 33, wherein for a luminous emission from the diffusely reflective emissive region, a secondary image luminous intensity comprises less than about 20 percent of a primary image luminous intensity.

Item 35 is the display element of item 19 to item 34, having an emissive gain greater than 1.1, a blur peak less than about 0.1, and a reflective gain less than about 3.0.

Item 36 is a pixelated display comprising at least one of the display elements of item 1 to item 35.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A display element, comprising:
    an organic light emitting diode (OLED) having a top surface comprising a diffusely reflective emissive region and an adjacent diffusely reflective inactive region; and
    an antireflection stack adjacent the top surface, comprising:
        an absorptive polarizer disposed adjacent the top surface;
        a reflective polarizer disposed between the top surface and the absorptive polarizer, wherein the reflective polarizer is in contact with the absorptive polarizer, and wherein the reflective polarizer is selected from polymeric multilayer optical films and continuous/disperse phase polarizers, and wherein the fast axis of each polarizer is in alignment;
        a retarder disposed between the top surface and the reflective polarizer, the fast axis of the retarder aligned at an angle to the fast axis of the polarizers; and
        a diffuse element between the retarder and the reflective polarizer.

2. The display element of claim 1, wherein the diffusely reflective emissive region has a first diffuse reflectance that is greater than a second diffuse reflectance of the diffusely reflective inactive region.

3. The display element of claim 1, wherein the diffusely reflective emissive region and the adjacent diffusely reflective inactive region are each substantially polarization preserving diffuse reflectors.

4. The display element of claim 1, wherein the retarder is a quarter-wave retarder having a retarder fast axis aligned at a 45 degree angle to the absorptive polarizer fast axis.

5. The display element of claim 1, wherein the diffusely reflective emissive region and the adjacent diffusely reflective inactive region are each characterized by an angular distribution of reflectance having a half-width greater than approximately 10 degrees.

6. The display element of claim 1, wherein the diffusely reflective emissive region and the adjacent diffusely reflective inactive region are each characterized by an angular distribution of reflectance having a half-width greater than approximately 5 degrees.

7. The display element of claim 1, wherein the diffusely reflective emissive region and the adjacent diffusely reflective inactive region are each characterized by an angular distribution of reflectance having a half-width greater than approximately 3 degrees.

8. The display element of claim 1, wherein the first and second diffuse reflectance are each characterized by a specular reflectance component between about 20 percent and about 80 percent of the total reflectance.

9. The display element of claim 1, wherein the first and second diffuse reflectance are each characterized by a diffuse reflectance component greater than about 20 percent of the total reflectance.

10. The display element of claim 1, wherein the first and second diffuse reflectance are each characterized by a diffuse reflectance component greater than about 30 percent of the total reflectance.

11. The display element of claim 1, wherein an emissive gain is greater than about 1.1 when compared to the OLED without the antireflection stack.

12. The display element of claim 1, wherein a separation distance between the top surface of the OLED and the retarder is greater than about 10 microns.

13. The display element of claim 1, wherein a separation distance between the top surface of the OLED and the retarder is greater than about 50 microns.

14. The display element of claim 1, wherein a separation distance between the top surface of the OLED and the retarder is greater than about 100 microns.

15. The display element of claim 1, wherein for a luminous emission from the diffusely reflective emissive region, a secondary image luminous intensity comprises less than about 50 percent of a primary image luminous intensity.

16. The display element of claim 1, wherein for a luminous emission from the diffusely reflective emissive region, a secondary image luminous intensity comprises less than about 30 percent of a primary image luminous intensity.

17. The display element of claim 1, wherein for a luminous emission from the diffusely reflective emissive region, a secondary image luminous intensity comprises less than about 20 percent of a primary image luminous intensity.

18. The display element of claim 1, having an emissive gain greater than 1.1, a blur peak less than about 0.1, and a reflective gain less than about 3.0.

19. A display element, comprising:
    an organic light emitting diode (OLED) having a top surface comprising a diffusely reflective emissive region and an adjacent diffusely reflective inactive region;
    an antireflection stack adjacent the top surface, comprising:
        an absorptive polarizer disposed adjacent the top surface;
        a reflective polarizer disposed between the top surface and the absorptive polarizer, wherein the reflective polarizer is in contact with the absorptive polarizer, and wherein the reflective polarizer is selected from polymeric multilayer optical films and continuous/disperse phase polarizers, the fast axis of each polarizer in alignment, and the reflective polarizer being spaced a separation distance of greater than 10 microns from the top surface; and
        a retarder disposed between the top surface and the reflective polarizer, a retarder fast axis aligned at an angle to the fast axis of the polarizers; and
    a diffuse element between the retarder and the reflective polarizer.

20. The display element of claim 19, wherein the diffusely reflective emissive region has a first diffuse reflectance that is greater than a second diffuse reflectance of the diffusely reflective inactive region.

21. The display element of claim 19, wherein the diffusely reflective emissive region and the adjacent diffusely reflective inactive region are each substantially polarization preserving diffuse reflectors.

22. The display element of claim 19, wherein the retarder is a quarter-wave retarder having a retarder fast axis aligned at a 45 degree angle to the absorptive polarizer fast axis.

23. The display element of claim 19, wherein the diffusely reflective emissive region and the adjacent diffusely reflective inactive region are each characterized by an angular distribution of reflectance having a half-width greater than approximately 10 degrees.

24. The display element of claim 19, wherein the diffusely reflective emissive region and the adjacent diffusely reflective inactive region are each characterized by an angular distribution of reflectance having a half-width greater than approximately 5 degrees.

25. The display element of claim 19, wherein the diffusely reflective emissive region and the adjacent diffusely reflective inactive region are each characterized by an angular distribution of reflectance having a half-width greater than approximately 3 degrees.

26. The display element of claim 19, wherein the first and second diffuse reflectance are each characterized by a specular reflectance component between about 20 percent and about 80 percent of the total reflectance.

27. The display element of claim 19, wherein the first and second diffuse reflectance are each characterized by a diffuse reflectance component greater than about 20 percent of the total reflectance.

28. The display element of claim 19, wherein the first and second diffuse reflectance are each characterized by a diffuse reflectance component greater than about 30 percent of the total reflectance.

29. The display element of claim 19, wherein an emissive gain is greater than about 1.1 when compared to the OLED without the antireflection stack.

30. The display element of claim 19, wherein a separation distance between the top surface of the OLED and the reflective polarizer is greater than about 50 microns.

31. The display element of claim 19, wherein a separation distance between the top surface of the OLED and the reflective polarizer is greater than about 100 microns.

32. The display element of claim 19, wherein for a luminous emission from the diffusely reflective emissive region, a secondary image luminous intensity comprises less than about 50 percent of a primary image luminous intensity.

33. The display element of claim 19, wherein for a luminous emission from the diffusely reflective emissive region, a secondary image luminous intensity comprises less than about 30 percent of a primary image luminous intensity.

34. The display element of claim 19, wherein for a luminous emission from the diffusely reflective emissive region, a secondary image luminous intensity comprises less than about 20 percent of a primary image luminous intensity.

35. The display element of claim 19, having an emissive gain greater than 1.1, a blur peak less than about 0.1, and a reflective gain less than about 3.0.

36. A pixelated display comprising the display element of claim 1.

* * * * *